US008410354B2

(12) United States Patent
Yamazaki

(10) Patent No.: US 8,410,354 B2
(45) Date of Patent: Apr. 2, 2013

(54) PHOTOELECTRIC CONVERSION DEVICE AND MANUFACTURING METHOD THEREOF

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 260 days.

(21) Appl. No.: 12/435,133

(22) Filed: May 4, 2009

(65) Prior Publication Data

US 2009/0277504 A1   Nov. 12, 2009

(30) Foreign Application Priority Data

May 9, 2008   (JP) ................................. 2008-123332

(51) Int. Cl.
*H01L 31/00* (2006.01)
(52) U.S. Cl. .......... 136/258; 136/261; 136/255; 257/53; 257/E31.045; 257/E31.047; 427/574; 427/74; 438/96; 438/97
(58) Field of Classification Search .................. 136/258, 136/261, 255; 438/96, 97; 257/53, E31.045, 257/E31.047; 427/574, 74
See application file for complete search history.

(56) References Cited

U.S. PATENT DOCUMENTS

| 4,409,134 | A | 10/1983 | Yamazaki |
| 4,771,015 | A | 9/1988 | Kanai et al. |
| 5,007,971 | A | 4/1991 | Kanai et al. |
| 5,677,236 | A | 10/1997 | Saitoh et al. |
| 5,810,945 | A | 9/1998 | Stutzmann et al. |
| 6,265,288 | B1 | 7/2001 | Okamoto et al. |
| 6,268,235 | B1 | 7/2001 | Sakakura et al. |
| 6,287,888 | B1 | 9/2001 | Sakakura et al. |

(Continued)

FOREIGN PATENT DOCUMENTS

| JP | 62-062073 | 12/1987 |
| JP | 02-053941 | 11/1990 |

(Continued)

OTHER PUBLICATIONS

O. Vetterl, F. Finger, R. carius, P. Hapke, L. Houben, O. Kluth, A. Lambertz, A. Muck, B. Rech, H. Wagner, "Intrinsic microcrystalline silicon: A new material for photovoltaics", Solar Energy Materials and Solar Cells, 2000, vol. 62, p. 97-108.*

(Continued)

*Primary Examiner* — Jennifer Michener
*Assistant Examiner* — Marla D McConnell
(74) *Attorney, Agent, or Firm* — Fish & Richardson P.C.

(57) ABSTRACT

Higher conversion efficiency and productivity of photoelectric conversion devices. A semiconductor layer including a first and second crystal regions grown in the layer-deposition direction is provided between an impurity semiconductor layer containing an impurity element imparting one conductivity type and an impurity semiconductor layer containing an impurity element imparting a conductivity type opposite to the one conductivity type. The first crystal region is grown from the interface between one of the impurity semiconductor layers and the semiconductor layer. The second crystal region is grown toward the interface between the semiconductor layer and the other of the impurity semiconductor layers from a position which is away from the interface between the one of the impurity semiconductor layers and the semiconductor layer. The semiconductor layer including the first and second crystal regions which exist in an amorphous structure forms the main part of a region for photoelectric conversion.

16 Claims, 13 Drawing Sheets

U.S. PATENT DOCUMENTS

| | | |
|---|---|---|
| 6,326,304 B1 | 12/2001 | Yoshimi et al. |
| 6,531,711 B2 | 3/2003 | Sakakura et al. |
| 2005/0022864 A1 | 2/2005 | Fujioka et al. |
| 2006/0065297 A1 | 3/2006 | Terakawa |
| 2009/0047752 A1 | 2/2009 | Yamazaki et al. |
| 2009/0261328 A1 | 10/2009 | Miyairi et al. |
| 2009/0267066 A1 | 10/2009 | Yamazaki et al. |
| 2009/0293954 A1 | 12/2009 | Yamazaki |
| 2010/0096631 A1 | 4/2010 | Miyairi et al. |
| 2010/0096637 A1 | 4/2010 | Yamazaki et al. |
| 2011/0193087 A1 | 8/2011 | Yamazaki et al. |

FOREIGN PATENT DOCUMENTS

| | | |
|---|---|---|
| JP | 2000-124489 | 4/2000 |
| JP | 2000-277439 | 10/2000 |
| JP | 2005-50905 | 2/2005 |

OTHER PUBLICATIONS

T. Kamei, M. Kondo, A. Matsuda, "A significant reduction of impurity contents in hydrogenated microcrystalline silicon films for increased grain size and reduced defect density", 1998, Jpn. J. Appl. Phys. vol. 37, p. L265-L268.*

M. Kondo and A. Matsuda, "Low temperature growth of microcrystalline silicon and its application to solar cells", Thin Solid Films, 2001, vol. 383, p. 1-6.*

L. Houben, C. Scholten, M. Luysberg, O. Vetterl, F. Finger, R. Carius, "Growth of microcrystalline nop Si solar cells: role of local epitaxy", 2002, Journal of Non-Crystaline Solids, vol. 299-302, p. 1189-1193.*

U. Das, S. Morrison, E. Centurioni, and A. Madan, "Thin film silicon materials and solar cells grown by pulsed PECVD technique", IEE Proc.-Circuits Devices Syst., 2003, vol. 150, p. 282-286.*

Yan et al.; "Correlation of Current Mismatch and Fill Factor in Amorphous and Nanocrystalline Silicon Based High Efficiency Multi-Junction Solar Cells"; *Conference Record of the 33th IEEE PVSC.(Photovoltaic Specialists Conference)* vol. 5 , pp. 12-16; 2008.

Yan et al.; "Correlation of Current Mismatch and Fill Factor in Amorphous and Nanocrystalline Silicon Based High Efficiency Multi-Junction Solar Cells"; Conference Record of the 33rd IEEE PVSC (Photovoltaic Specialists Conference), pp. 1-6; 2008.

\* cited by examiner

PHOTOELECTRIC CONVERSION DEVICE AND MANUFACTURING METHOD THEREOF

BACKGROUND OF THE INVENTION

1. Field of the Invention

The present invention relates to a photoelectric conversion device including a semiconductor junction and a method for manufacturing the photoelectric conversion device.

2. Description of the Related Art

To deal with global environmental issues in recent years, the market for photoelectric conversion devices typified by solar cells such as residential photovoltaic systems has expanded. Bulk photoelectric conversion devices using single crystal silicon or polycrystalline silicon, which have high photoelectric conversion efficiency, have already been put into practical use. The photoelectric conversion devices using single crystal or polycrystalline silicon are manufactured by cutting wafers from large silicon ingots. However, since it takes a long time to manufacture large silicon ingots, the productivity is low, and since supply of raw materials of silicon itself is limited, the supply of silicon ingots is in short and cannot keep up with the expansion of the market.

As the shortage of raw materials of silicon becomes obvious as described above, thin-film photoelectric conversion devices using silicon thin films are attracting attention. In the thin-film photoelectric conversion devices, silicon thin films are formed over supporting substrates by a variety of chemical or physical growth methods. Therefore, it is said that the thin-film photoelectric conversion devices enable resource saving and cost reduction as compared with the bulk photoelectric conversion devices.

Development has been conducted on photoelectric conversion devices using amorphous silicon thin films, and development on photoelectric conversion devices using microcrystalline silicon thin films are also in progress in recent years. For example, a method for manufacturing a silicon thin film solar cell, in which microcrystalline silicon is formed as crystalline silicon by the control of the pulse modulation of a high-frequency electric power in a high-frequency plasma CVD method has been proposed (see, for example, Patent Document 1). Further, a method in which the deposition rate is increased by forming a silicon-based thin film photoelectric conversion layer using a crystalline substance with the controlled pressure in a reaction chamber by a low-temperature plasma CVD method has been proposed (see, for example, Patent Document 2).

Patent Document 1: Japanese Published Patent Application No. 2005-50905
Patent Document 2: Japanese Published Patent Application No. 2000-124489

SUMMARY OF THE INVENTION

As for photoelectric conversion devices using amorphous silicon thin films, the manufacturing process is simple and the cost can be reduced. However, they are not popular because the photoelectric conversion efficiency is lower than that of bulk photoelectric conversion devices and there is still a problem of photodegradation called Staebler-Wronski effect.

The photodegradation can be suppressed by the use of microcrystalline silicon instead of amorphous silicon. However, since a microcrystalline silicon film is formed with the use of a semiconductor source gas typified by silane diluted with a large amount of hydrogen gas, there is a problem of low deposition rate. Further, since the light absorption coefficient of microcrystalline silicon is lower than that of amorphous silicon, a photoelectric conversion layer formed using microcrystalline silicon needs to be thicker than that formed using amorphous silicon. For these reasons, photoelectric conversion devices using microcrystalline silicon are inferior in productivity to those using amorphous silicon.

In Patent Document 1, crystalline silicon (microcrystalline silicon is given as an example therein) is deposited with uniform crystallinity and film-quality by the control of pulse modulation in a high-frequency plasma CVD method; however, it is not practical because the deposition rate is low as compared with the deposition of amorphous silicon. On the other hand, in Patent Document 2, the deposition rate is improved, but a silicon layer still needs to be thicker than in the case of using amorphous silicon by several digits; therefore, the problem in productivity remains unsolved. Accordingly, at present, the improvement of productivity and the improvement of characteristics such as the improvement of the efficiency cannot be achieved at the same time and the popularity of photoelectric conversion devices using silicon thin films comes short of that of bulk photoelectric conversion devices.

In view of the foregoing problems, an object of an embodiment of the present invention is to achieve the improvement in both efficiency and productivity of photoelectric conversion devices. Another object of an embodiment of the present invention is to provide a method for manufacturing photoelectric conversion devices having high efficiency by a simple manufacturing process. Another object of an embodiment of the present invention is to provide a photoelectric conversion device in which change in characteristics due to photodegradation or the like is prevented.

An embodiment of the present invention is a photoelectric conversion device including a semiconductor junction. The photoelectric conversion device includes an impurity semiconductor layer to which an impurity element imparting one conductivity type is added, an impurity semiconductor layer to which an impurity element imparting a conductivity type opposite to the one conductivity type is added, and a semiconductor layer including a first crystal region and a second crystal region grown in the deposition direction of the layer, between the impurity semiconductor layers. The first crystal region is grown in the deposition direction of the layer from the interface between one of the impurity semiconductor layers and the semiconductor layer. The second crystal region is grown in the deposition direction of the layer (toward the interface between the semiconductor layer and the other of the impurity semiconductor layers) from a position which is away from the interface between the one of the impurity semiconductor layers and the semiconductor layer. The first crystal region and the second crystal region exist in an amorphous structure. The semiconductor layer in which the first crystal region and the second crystal region are included in the amorphous structure forms the main part of a region for performing photoelectric conversion of the photoelectric conversion device according to one embodiment of the present invention.

The semiconductor layer including the first crystal region and the second crystal region is formed over the impurity semiconductor layer having one conductivity type formed using a microcrystalline semiconductor. The semiconductor layer including the first crystal region and the second crystal region is formed with plasma produced by a semiconductor source gas (typically, silane) and a dilution gas (typically, hydrogen), introduced into a reaction chamber as reaction gases. At this time, at the initial stage, film deposition is performed with the flow rate of the dilution gas to the semiconductor source gas, being greater than or equal to 1 time and less than or equal to 6 times, so that the impurity semiconductor layer formed using a microcrystalline semiconductor serves as a seed crystal to form the film in which the first crystal region grown from the impurity semiconductor layer in the deposition direction of the layer exists in an amorphous structure.

After the film deposition with the flow rate of the dilution gas to the semiconductor source gas, being greater than or equal to 1 time and less than or equal to 6 times, the flow rate of the dilution gas to the semiconductor source gas is adjusted to be a mixture ratio capable of production of a microcrystalline semiconductor to produce plasma. Film deposition is performed for a predetermined period of time while an impurity element which interrupts crystal nucleation (typically, nitrogen) is contained in a reaction space where the oxygen concentration is low, and after that, the concentration of the impurity elements is decreased to perform crystal nucleation and film deposition is continued. In this manner, the film in which the second crystal region grown from a position which is away from the interface between the impurity semiconductor layer formed using a microcrystal semiconductor and the film in the deposition direction of the layer exists in an amorphous structure is formed. Through the above steps, the semiconductor layer in which the first crystal region and the second crystal region are included in the amorphous structure is formed. Then, the impurity semiconductor layer having a conductivity type opposite to the one conductivity type of the impurity semiconductor layer is formed over the semiconductor layer including the first crystal region and the second crystal region.

In the above-described structure, it is preferable that the first crystal region and the second crystal region each have a conical or pyramidal structure. Further, it is preferable that the first crystal region has a conical or pyramidal structure grown while decreasing its width from the impurity semiconductor layer formed using a microcrystalline semiconductor in the deposition direction of the layer. It is preferable that the second crystal region has a reverse-conical or -pyramidal structure grown while increasing its width from a crystal nucleus which is positioned away from the interface between the impurity semiconductor layer formed using a microcrystalline semiconductor and the semiconductor layer, in the deposition direction of the layer. In the semiconductor layer including the first crystal region and the second crystal region, the first crystal region exists on the interface side between the impurity semiconductor layer formed using a microcrystalline semiconductor and the semiconductor layer, and the second crystal region exists on the upper-surface side which is opposite to the interface side, in the deposition direction of the layer.

An embodiment of the present invention is a photoelectric conversion device which includes a first semiconductor layer containing an impurity element imparting one conductivity type, which is formed using a microcrystalline semiconductor and provided over a first electrode; a second semiconductor layer provided over the first semiconductor layer; a third semiconductor layer containing an impurity element imparting a conductivity type which is opposite to the one conductivity type, provided over the second semiconductor layer; and a second electrode which is provided over the third semiconductor layer. The second semiconductor layer includes on the interface side between the second semiconductor layer and the first semiconductor layer, a first crystal region having a three-dimensional shape which decreases its width from the interface between the second semiconductor layer and the first semiconductor layer toward the third semiconductor layer, and includes on the interface side between the second semiconductor layer and the third semiconductor layer, a second crystal region having a three-dimensional shape which decreases its width from the interface between the second semiconductor layer and the third semiconductor layer toward the first semiconductor layer.

In the above-described structure, it is preferable that the first crystal region is grown while decreasing its width on the first semiconductor layer in the deposition direction of the second semiconductor layer. It is preferable that the second crystal region is grown while increasing its width from a position which is away from the interface between the first semiconductor layer and the second semiconductor layer. The second semiconductor layer may have a structure in which the first crystal region which is a crystalline semiconductor and the second crystal region which is a crystalline semiconductor exist in an amorphous structure. Further, the second crystal region may be a single crystal or a single crystal including a twin crystal.

In the above-described structure, in the second semiconductor layer, the second crystal region is grown toward the interface between the second semiconductor layer and the third semiconductor layer from a region where the nitrogen concentration measured by secondary ion mass spectrometry is more than or equal to $2 \times 10^{20}/cm^3$ and less than or equal to $7 \times 10^{20}/cm^3$. Further, in the second semiconductor layer, the peak concentration of nitrogen measured by secondary ion mass spectrometry is $3 \times 10^{20}/cm^3$ to $1 \times 10^{21}/cm^3$ at and near a crystal nucleus in the second crystal region, and the nitrogen concentration is decreased from the crystal nucleus toward the interface between the second semiconductor layer and the third semiconductor layer. In this case, it is preferable that the oxygen concentration in the second semiconductor layer measured by secondary ion mass spectrometry is less than or equal to $5 \times 10^{18}/cm^3$.

Further, in the above-described structure, the first semiconductor layer may be an n-type semiconductor, the second semiconductor layer may be an i-type semiconductor, and the third semiconductor layer may be a p-type semiconductor.

One embodiment of the present invention includes the following steps: a first semiconductor layer is formed using a microcrystalline semiconductor containing an impurity element imparting one conductivity type over a first electrode; over the first semiconductor layer, at the initial stage, plasma is produced by a reaction gas with the flow rate of the dilution gas to the semiconductor source gas, being greater than or equal to 1 time and less than or equal to 6 times, introduced into the reaction chamber to form a part of a second semiconductor layer including a first crystal region grown from the interface between the first semiconductor layer and the film in the deposition direction of the film, and after that, plasma is produced by the semiconductor source gas and the dilution gas with a mixture ratio capable of production of a microcrystalline semiconductor, introduced into the reaction chamber, an impurity element which interrupts crystal nucleation is contained, and film deposition is started, and after that, the concentration of the impurity elements which interrupt crystal nucleation is decreased to produce a crystal nucleus and a part of the second semiconductor layer including a second crystal region grown from a position which is away from the interface between the first semiconductor layer and the film in the deposition direction of the film, so that the second semiconductor layer in which the first crystal region and the second crystal region are included in an amorphous structure is formed; a third semiconductor layer containing an impurity element imparting a conductivity type which is opposite to the one conductivity type is formed over the second semiconductor layer; and a second electrode is formed over the third semiconductor layer.

In the above-described structure, it is preferable that, after the deposition of the film containing the first crystal region, a gas containing the impurity element which interrupts crystal nucleation is introduced into the reaction chamber temporarily such that the impurity element which interrupts crystal nucleation remains and then the gas containing the impurity element which interrupts crystal nucleation is exhausted. Further, it is preferable to use nitrogen as the impurity element which interrupts crystal nucleation.

As the semiconductor source gas, silicon hydride, fluoride silicon, or silicon chloride can be used. As the dilution gas, hydrogen can be used.

A photoelectric conversion layer in this specification includes in its category a semiconductor layer by which a photoelectric (internal photoelectric) effect is achieved and moreover an impurity semiconductor layer bonded for forming an internal electric field. That is to say, the photoelectric conversion layer refers to a semiconductor layer having junction typified by a p-n junction, a p-i-n junction, or the like.

According to an embodiment of the present invention, a semiconductor layer in which a crystal region is included in an amorphous structure is formed as a main part for photoelectric conversion, so that the efficiency higher than that of conventional photoelectric conversion devices using amorphous silicon can be achieved. Further, with the semiconductor layer in which a crystal region is included in an amorphous structure, photodegradation or the like can be suppressed, so that change in characteristics can be suppressed as compared with conventional photoelectric conversion devices using amorphous silicon. Further, the thickness or the like of the photoelectric conversion layer can be as small as that of photoelectric conversion devices using amorphous silicon, whereby the productivity can be improved as compared with conventional photoelectric conversion devices using microcrystalline silicon. Accordingly, photoelectric conversion devices in which characteristics and productivity are both improved can be provided by the present invention.

DETAILED DESCRIPTION OF THE INVENTION

Figure 1:
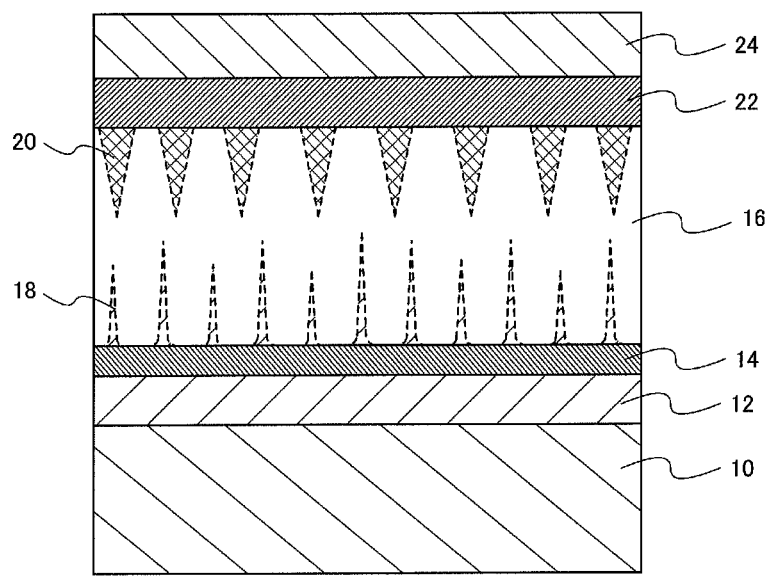
FIG. 1 is a pattern diagram of a photoelectric conversion device according to one embodiment of the present invention.

Embodiments of the present invention will be explained with reference to the drawings. However, the present invention is not limited to the description below, and it is to be easily understood by those skilled in the art that various changes in modes and details thereof will be apparent without departing from the purpose and scope of the present invention. Therefore, the present invention should not be interpreted as being limited to the description of the embodiments to be given below. For the description of the present invention hereinbelow, the same portions are denoted by the same reference numerals through the drawings.

Embodiment 1

FIG. 1 shows a structure of a photoelectric conversion device according to Embodiment 1. The photoelectric conversion device shown in FIG. 1 includes a first electrode 12 provided over a substrate 10, a first semiconductor layer 14 provided over the first electrode 12, a second semiconductor layer 16 provided over the first semiconductor layer 14, a third semiconductor layer 22 provided over the second semiconductor layer 16, and a second electrode 24 provided over the third semiconductor layer 22. The first semiconductor layer 14 and the third semiconductor layer 22 are impurity semiconductor layers in which the conductivity types of impurity elements added thereto are opposite to each other; one is an n-type semiconductor layer and the other is a p-type semiconductor layer. The second semiconductor layer 16 provided between the first semiconductor layer 14 and the third semiconductor layer 22 is an i-type semiconductor layer in which a first crystal region and a second crystal region are contained in an amorphous structure. The photoelectric conversion device according to one embodiment of the present invention includes a semiconductor layer that is a semiconductor layer including a first crystal region and a second crystal region which are grown in the deposition direction of the layer, between the first semiconductor layer 14 and the third semiconductor layer 22 that are a pair of impurity semiconductor layers. With this structure, the photoelectric conversion device according to Embodiment 1 includes at least one semiconductor junction. The example in which the first semiconductor layer 14 is an n-type semiconductor, the third semiconductor layer 22 is a p-type semiconductor, and the second semiconductor layer is an i-type semiconductor is described here.

The second semiconductor layer 16 includes crystal regions existing discretely on the interface side between the first semiconductor layer 14 and the second semiconductor layer 16 and on the interface side between the third semiconductor layer 22 and the second semiconductor layer 16, and is a semiconductor layer in which the crystal regions exist in an amorphous structure. The crystal regions each include a crystal semiconductor such as a polycrystal, a single crystal, or a single crystal including a twin crystal. The amorphous structure is an amorphous semiconductor and is typically amorphous silicon. The amorphous semiconductor typified by amorphous silicon is direct-transition type and has a high light-absorption coefficient. Therefore, the amorphous structure of the second semiconductor layer 16 generates photogenerated carriers more easily than the crystal regions. Further, the bandgap of the amorphous structure of the second semiconductor layer 16 is 1.6 to 1.8 eV whereas the bandgap of each crystal region is about 1.1 to 1.4 eV. From this relationship, the photogenerated carriers generated in the second semiconductor layer 16 move into the crystal regions by diffusion or drift. The crystal regions each function as a conduction path (carrier path) of photogenerated carriers. With this structure, the probability that photogenerated carriers will be trapped by defect levels of the second semiconductor layer 16 is decreased, and photogenerated carriers flow through the crystal regions even when photoinduced defects are generated, so that high photoelectric conversion characteristic can be kept. In addition, since the crystal regions in the second semiconductor layer 16 exist on the interface side between the first semiconductor layer 14 and the second semiconductor layer 16 and on the interface side between the third semiconductor layer 22 and the second semiconductor layer 16, both electrons and holes which are photogenerated carriers can easily flow through the crystal regions. Accordingly, change of characteristics due to photodegradation which has been a problem can be reduced.

It is preferable that the crystal regions included in the second semiconductor layer 16 are conical or pyramidal structures which decrease their widths towards the inside of the second semiconductor layer 16 from the interface side between the first semiconductor layer 14 and the second semiconductor layer 16 and from the interface side between the third semiconductor layer 22 and the second semiconductor layer 16. The conical or pyramidal shape here means a three-dimensional shape and is constructed by a base which is constructed by a plurality of planes and lines linking the periphery of the base and a vertex which is located outside the base; and in this specification, the one whose vertex is positioned on the substrate side is also referred to as a "reverse-conical or -pyramidal shape" for convenience.

Illustrated in FIG. 1 is the example in which in the second semiconductor layer 16, first crystal regions 18 exist discretely on the interface side between the first semiconductor layer 14 and the second semiconductor layer 16 and second crystal regions 20 exist discretely on the interface side between the third semiconductor layer 22 and the second semiconductor layer 16. In the second semiconductor layer 16, the first crystal regions 18 and the second crystal regions 20 exist in the amorphous structure.

The first crystal regions 18 and the second crystal regions 20 each include a crystal semiconductor and are crystal regions grown in the deposition direction of the second semiconductor layer 16. The first crystal regions 18 are conical or pyramidal crystal regions which are grown while decreasing their widths from the interface between the first semiconductor layer 14 and the second semiconductor layer 16 in the deposition direction of the second semiconductor layer 16 and which exist discretely on the interface side between the first semiconductor layer 14 and the second semiconductor layer 16.

The second crystal regions 20 are reverse-conical or -pyramidal crystal regions which are grown while increasing their widths from the position which is away from the interface between the first semiconductor layer 14 and the second semiconductor layer 16 in the deposition direction of the second semiconductor layer 16 and which exist discretely on the interface side between the second semiconductor layer 16 and the third semiconductor layer 22. A crystal nucleus in each second crystal region 20 is positioned away from the interface between the first semiconductor layer 14 and the second semiconductor layer 16 and a crystal is grown so as to spread in in-plane direction of a plane which is perpendicular to the growth direction of the crystal from the crystal nucleus. The second crystal regions 20 are also conical or pyramidal crystal regions when they are seen from the interface side between the second semiconductor layer 16 and the third semiconductor layer 22. The production position of the crystal nucleus that is the start position of the growth of each second crystal region 20 is controlled here by the concentration of the impurity elements which interrupt crystal nucleation, typically the concentration of nitrogen. Specifically, the oxygen concentration is decreased and the nitrogen concentration is increased to be higher than the oxygen concentration, and the nitrogen concentration is decreased in accordance with the growth of the second crystal regions 20, so that the second crystal regions 20 can be formed while suppressing production of a crystal nucleus that is the start position of the growth of each second crystal region 20. When the production of crystal nuclei is controlled by nitrogen, a crystal nucleus is produced to form each second crystal region 20 when the nitrogen concentration measured by secondary ion mass spectrometry is more than or equal to $1 \times 10^{20}/cm^3$ and less than or equal to $1 \times 10^{21}/cm^3$, preferably more than or equal to $2 \times 10^{20}/cm^3$ and less than or equal to $7 \times 10^{20}/cm^3$. That is, at the production position of a crystal nucleus (vertex of the reverse-conical or -pyramidal shape) that is the start position of the growth of each second crystal region 20, the nitrogen concentration measured by secondary ion mass spectrometry is more than or equal to $1 \times 10^{20}/cm^3$ and less than or equal to $1 \times 10^{21}/cm^3$, preferably more than or equal to $2 \times 10^{20}/cm^3$ and less than or equal to $7 \times 10^{20}/cm^3$. Further, it is preferable that the nitrogen concentration is higher than the oxygen concentration by at least one digit. Specifically, at and near a crystal nucleus of each second crystal region 20, the oxygen concentration measured by secondary ion mass spectrometry is less than or equal to $5 \times 10^{18}/cm^3$ and the nitrogen concentration more than or equal to $1 \times 10^{20}/cm^3$ and less than or equal to $1 \times 10^{21}/cm^3$.

At the initial stage of forming the second semiconductor layer 16, plasma is produced by a reaction gas with the flow rate of the dilution gas to the semiconductor source gas, being greater than or equal to 1 time and less than or equal to 6 times, introduced into a reaction space to deposit a film. The film deposition is performed for a while. After that, the flow ratio between the dilution gas and the semiconductor source gas is adjusted to be a mixture ratio capable of production of a microcrystalline semiconductor and the reaction gas with this mixture ratio is introduced into the reaction space, an impurity element which interrupts crystal nucleation is contained in the reaction space, and film deposition is performed for a while. The concentration of the impurity elements which interrupt crystal nucleation is decreased, which produces crystal nuclei in the second semiconductor layer 16. Film deposition is further continued to grow crystal regions from the crystal nuclei, whereby the second semiconductor layer 16 in which a plurality of crystal regions are included in an amorphous structure is obtained. It is preferable that the oxygen concentration in the reaction space is low, at least in forming the film containing the impurity elements which interrupt crystal nucleation.

In the above-described deposition of the second semiconductor layer 16, film deposition is performed with the reaction gas with the flow rate of the dilution gas to the semiconductor source gas, being greater than or equal to 1 time and less than or equal to 6 times, so that a structure in which the first crystal regions 18 grown from the first semiconductor layer 14 exist in an amorphous structure can be obtained. Subsequently, the flow ratio between the dilution gas and the semiconductor source gas is adjusted to be a mixture ratio capable of production of a microcrystalline semiconductor and the reaction gas with this mixture ratio is introduced into the reaction space where the oxygen concentration is low, and plasma is produced, an impurity element which interrupts crystal nucleation is contained in the reaction space, and film deposition is performed for a while. Then, the concentration of the impurity elements which interrupt crystal nucleation is decreased, which produces crystal nuclei, and film deposition is further continued. In this manner, a structure in which the second crystal regions 20 grown from the crystal nuclei which are positioned away from the interface between the first semiconductor layer 14 and the second semiconductor layer 16 exist in an amorphous structure can be obtained. Through the above, the semiconductor layer in which the first crystal regions 18 and the second crystal regions 20 exist in an amorphous structure can be formed. The second semiconductor layer 16 is formed by at least two film-deposition conditions in order to form the first crystal regions 18 and the second crystal regions 20. Film deposition is performed for a predetermined period of time with a first condition; film deposition is performed with the nitrogen concentration being higher by at least one digit than oxygen concentration; and film deposition is further performed while decreasing the nitrogen concentration with a second condition, so that crystal nuclei are produced when the nitrogen concentration reaches a predetermined value. Then, film deposition is further continued, by which crystal growth proceeds from the crystal nuclei. In this manner, the semiconductor layer including a plurality of crystal regions can be formed.

The reaction gas for forming the second semiconductor layer 16 is introduced into the reaction chamber, so that plasma, typically glow discharge plasma, is produced while a predetermined pressure is kept. In this manner, a film (the second semiconductor layer 16) is formed over a substrate (the substrate 10 provided with the first semiconductor layer 14) disposed in the reaction space. According to one embodiment of the present invention, at the initial stage of the film deposition of the second semiconductor layer 16, film deposition is performed with the reaction gas with the flow rate of the dilution gas to the semiconductor source gas, being greater than or equal to 1 time and less than or equal to 6 times; and after that, the flow ratio between the dilution gas and the semiconductor source gas is adjusted to change the mixture ratio and the concentration of an impurity element which interrupts crystal nucleation, typically nitrogen, is controlled, and film deposition is performed. As for the reaction gas used at the initial stage of the film deposition of the second semiconductor layer 16, the flow rate of the dilution gas to the semiconductor source gas is controlled to be greater than or equal to 1 time and less than or equal to 6 times, with which the first crystal regions 18 are grown using the first semiconductor layer 14 which is a microcrystalline semiconductor as a seed crystal in the deposition direction of the second semiconductor layer 16. The first crystal regions 18 can be grown by controlling the diluted amount of the reaction gas for forming the second semiconductor layer 16. Subsequently, the mixture ratio of the reaction gas for forming the second semiconductor layer 16, for example, the reaction gas at a later stage of the film deposition of the second semiconductor layer 16 is adjusted to be a mixture ratio capable of production of a microcrystalline semiconductor, nitrogen is contained as an impurity element which interrupts crystal nucleation, and film deposition is performed for a predetermined period of time. After that, the nitrogen concentration is decreased, by which crystal nuclei are produced, and film deposition is further continued, so that the second crystal regions 20 are grown from the crystal nuclei in the deposition direction of the second semiconductor layer 16. The second crystal regions 20 can be grown by controlling the concentration of the impurity elements which interrupt crystal nucleation and the mixture ratio of the reaction gas. It is preferable that at least in growing the second crystal regions 20, the oxygen concentration contained in the reaction chamber is low.

The second semiconductor layer 16 is formed using a semiconductor such as silicon or germanium. Specifically, the second semiconductor layer 16 can be formed using a reaction gas in which a semiconductor source gas typified by silane is diluted with a dilution gas typified by a hydrogen gas by a plasma CVD apparatus. As the semiconductor source gas, silicon hydride typified by silane or disilane can be used. Further, instead of silicon hydride, silicon chloride such as $SiH_2Cl_2$, $SiHCl_3$, or $SiCl_4$, or silicon fluoride such as $SiF_4$ can be used. Hydrogen gas is a typical example of the dilution gas. Dilution may be performed with one or more kinds of rare gases selected from helium, argon, krypton, and neon in order to form the second semiconductor layer 16. The dilution ratio of hydrogen to silicon hydride is set at a ratio greater than or equal to 1 time and less than or equal to 6 times at the initial stage of the deposition of the film (the second semiconductor layer 16), and then, adjusted to a mixture ratio capable of production of a microcrystalline semiconductor.

The second semiconductor layer 16 is formed using an i-type semiconductor in which the first crystal regions 18 and the second crystal regions 20 exist in an amorphous structure. Note that the i-type semiconductor in this specification is a semiconductor in which an impurity imparting p-type or n-type conductivity is contained at a concentration less than or equal to $1 \times 10^{20}/cm^3$, oxygen and nitrogen are contained at a concentration less than or equal to $9 \times 10^{19}/cm^3$, and photoconductivity is at least 100 times as high as the dark conductivity. This i-type semiconductor may include boron at 1 to 1000 ppm. That is, the i-type semiconductor has weak n-type electric conductivity when an impurity element for control of valence electrons is not added intentionally, and therefore, in the case where the i-type semiconductor is applied to the second semiconductor layer 16, an impurity element imparting p-type conductivity may be added at the same time as or after the formation of the second semiconductor layer 16. The impurity element imparting p-type conductivity is typically boron, and an impurity gas such as $B_2H_6$ or $BF_3$ may be mixed into the semiconductor source gas at 1 to 1000 ppm. The concentration of boron may be, for example, $1 \times 10^{14}$ to $6 \times 10^{16}/cm^3$.

The amorphous structure included in the second semiconductor layer 16, typically, amorphous silicon, is direct-transition type and has a high light-absorption coefficient. Therefore, the amorphous structure of the second semiconductor layer 16 generates photogenerated carriers more earlier than the first and second crystal regions 18 and 20. Further, the bandgap of the amorphous structure of the second semiconductor layer 16 is 1.6 to 1.8 eV whereas the bandgap of each crystal region of the first crystal regions 18 and the second crystal regions 20 is about 1.1 to 1.4 eV. From this relationship, the photogenerated carriers generated in the second semiconductor layer 16 flow through the first crystal regions 18 and the second crystal regions 20. With this structure, the probability that photogenerated carriers will be trapped by defect levels of the second semiconductor layer 16 is decreased, and photogenerated carriers flow through the first crystal regions 18 and the second crystal regions 20 even when photoinduced defects are generated, so that high photoelectric conversion characteristic can be kept. That is, change of characteristics due to photodegradation which has been a problem can be reduced.

The first semiconductor layer 14 is an impurity semiconductor layer including an impurity element imparting one conductivity type and is formed using a microcrystalline semiconductor. The first semiconductor layer 14 is formed over the first electrode 12 formed over the substrate 10. As the impurity element imparting one conductivity type, an impurity element imparting n-type conductivity (typically, phosphorus, arsenic, or antimony which is a Group 15 element in the periodic table) or an impurity element imparting p-type conductivity (typically, boron or aluminum which is a Group 13 element in the periodic table) is used. The microcrystalline semiconductor used for forming the first semiconductor layer 14 is microcrystalline silicon, microcrystalline silicon germanium, microcrystalline germanium, or the like. In Embodiment 1, the first semiconductor layer 14 is formed using microcrystalline silicon including phosphorus that is an impurity element imparting n-type conductivity.

The microcrystalline semiconductor layer in Embodiment 1 is a layer including a semiconductor having an intermediate structure between amorphous and crystalline (including single-crystal and polycrystal) structures. The microcrystalline semiconductor is a semiconductor having a third state which is stable in terms of free energy. For example, the microcrystalline semiconductor layer is a layer including a semiconductor having a crystal grain size greater than or equal to 2 nm and less than or equal to 200 nm, preferably greater than or equal to 10 nm and less than or equal to 80 nm, more preferably greater than or equal to 20 nm and less than or equal to 50 nm. The Raman spectrum of microcrystalline silicon, which is a typical example of a microcrystalline semiconductor, is shifted in lower wave-number side than 520/cm, which represents the Raman spectrum of single crystal silicon. That is, the peak of Raman spectrum of microcrystalline silicon is within the range from 520/cm, which represents single crystal silicon, to 480/cm, which represents amorphous silicon. The microcrystalline semiconductor includes hydrogen or halogen of at least 1 at. % or more to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor has lattice distortion which changes the optical characteristics from the indirect transition of single crystal silicon into the direct transition. At least 10% of lattice distortion makes the optical characteristics change into the direct transition. When distortion exits locally, the optical characteristics in which the direct transition and the indirect transition are mixed can be obtained. The description about the above-described microcrystalline semiconductor is disclosed in, for example, U.S. Pat. No. 4,409,134. In the present invention, the concept of the microcrystalline semiconductor is not fixed to only the above-described grain size; the microcrystalline semiconductor can be replaced with any other semiconductor material having a property value equivalent to the above value.

The microcrystalline semiconductor can be formed using a reaction gas in which a semiconductor source gas and a dilution gas are mixed at a mixture ratio capable of production of a microcrystalline semiconductor by a plasma CVD method. Specifically, a reaction gas in which a semiconductor source gas typified by silane is diluted with a hydrogen gas or the like is introduced into a reaction chamber and a predetermined pressure is kept to produce plasma, typically glow discharge plasma, so that a microcrystalline semiconductor film is formed on an object to be processed, in the reaction chamber. As the semiconductor source gas and the dilution gas, silicon hydride typified by silane or disilane, silicon fluoride, or silicon chloride and a dilution gas typified by a hydrogen gas can be used, and further, in addition to the semiconductor source gas and the hydrogen gas, one or more kinds of rare gas elements selected from helium, argon, krypton, and neon can be used. The flow rate of the dilution gas (for example, a hydrogen gas) to the semiconductor source gas (for example, silicon hydride) is set to be greater than or equal to 10 times and less than or equal to 200 times, preferably greater than or equal to 50 times and less than or equal to 150 times, more preferably equal to 100 times. For example, the microcrystalline semiconductor can be formed by glow discharge plasma in a reaction chamber of a plasma CVD apparatus, by diluting a semiconductor source gas typified by silane with a hydrogen gas or the like. The glow discharge plasma is produced by applying high-frequency power with a frequency of 1 to 20 MHz, typically 13.56 MHz, or VHF high-frequency power with a frequency of 30 to about 300 MHz, typically 27.12 MHz or 60 MHz. A high-frequency power with a frequency of 1 GHz or more may be applied. A carbide gas such as $CH_4$ or $C_2H_6$ or a germanium gas such as $GeH_4$ or $GeF_4$ may be mixed into the semiconductor source gas to adjust the energy band width to be 1.5 to 2.4 eV or 0.9 to 1.1 eV.

The third semiconductor layer 22 is an impurity semiconductor layer which is formed over the second semiconductor layer 16 and contains an impurity element imparting one conductivity type. The third semiconductor layer 22 contains the impurity element imparting a conductivity type opposite to the conductivity type of the first semiconductor layer 14 and is formed using a microcrystalline semiconductor or an amorphous semiconductor. In Embodiment 1, the third semiconductor layer 22 is formed using microcrystalline silicon containing boron that is an impurity element imparting p-type conductivity.

The process from the formation of the first semiconductor layer 14 through the third semiconductor layer 22 will be described below using FIG. 2.

In order to form the first semiconductor layer 14 over the substrate 10 provided with the first electrode 12, a reaction gas used for forming the first semiconductor layer 14 is introduced into a reaction space and plasma is produced. In Embodiment 1, in order to deposit n-type microcrystalline silicon, the flow ratio between an $SiH_4$ gas and a hydrogen gas is adjusted to be a mixture ratio capable of production of microcrystalline silicon and $PH_3$ in which an impurity element imparting n-type conductivity is contained is added to the reaction gas, and the reaction gas is introduced into the reaction chamber, and plasma is produced, so that the first semiconductor layer 14 is formed (N-type Impurity Silicon Layer Formation in FIG. 2).

Next, the second semiconductor layer 16 is formed over the first semiconductor layer 14. In one embodiment of the present invention, the second semiconductor layer 16 is formed in which the first crystal regions 18 and the second crystal regions 20 exist discretely in the amorphous structure and the first crystal regions 18 exist on the first semiconductor layer 14 side and the second crystal regions 20 exist on the third semiconductor layer 22 side. Described here is the example in which the second semiconductor layer 16 is formed with first and second conditions.

At the initial stage of the formation of the second semiconductor layer 16, the deposition is performed with the first condition. Under the first condition, the flow rate of the hydrogen gas to the $SiH_4$ gas is set to be greater than or equal to 1 time and less than or equal to 6 times and the reaction gas is introduced into the reaction chamber, so that plasma is produced to perform film deposition. In this manner, the first crystal regions 18 are grown from the first semiconductor layer 14 in the deposition direction of the second semiconductor layer 16 (First-Condition Film Formation in FIG. 2).

The film deposition is continued for a predetermined period of time with the first condition, and then, film deposition is performed with the second condition. Under the second condition, the flow rate of the hydrogen gas to the $SiH_4$ gas of the reaction gas is adjusted to a mixture ratio capable of production of a microcrystalline semiconductor, for example, to be greater than or equal to 10 times and less than or equal to 200 times, preferably greater than or equal to 50 times and less than or equal to 150 times, more preferably equal to 100 times and the reaction gas is introduced into the reaction space, so that plasma is produced to perform film deposition. At this time, in one embodiment of the present invention, in order to grow the second crystal regions 20, an impurity element which interrupts crystal nucleation is contained in the reaction space where the oxygen concentration is low, and film deposition is performed for a predetermined period of time, and after that, the concentration of the impurity elements which interrupt crystal nucleation is decreased, by which crystal nuclei are produced, and film deposition is further continued to grow the second crystal regions 20 from the crystal nuclei (Second-Condition Film Formation in FIG. 2). In this manner, the second semiconductor layer 16 in which the first crystal regions 18 and the second crystal regions 16 are included in an amorphous structure is obtained. Illustrated here is the example in which an ammonia ($NH_3$) gas is introduced into the reaction space so as to provide nitrogen as the impurity element which interrupts crystal nucleation. Instead of the ammonia gas, an $N_2$ gas or the like may be used.

Next, in order to form the third semiconductor layer 22 over the second semiconductor layer 16, a reaction gas used for the formation of the third semiconductor layer 22 is introduced into the reaction space and plasma is produced. In Embodiment 1, in order to deposit p-type microcrystalline silicon, the flow ratio between an $SiH_4$ gas and a hydrogen gas is adjusted to be a mixture ratio capable of production of microcrystalline silicon and $B_2H_6$ in which an impurity element imparting p-type conductivity is contained is added to the reaction gas, and the reaction gas is introduced into the reaction chamber, and plasma is produced, so that the third semiconductor layer 22 is formed (P-type Impurity Silicon Layer Formation in FIG. 2).

Figure 2:
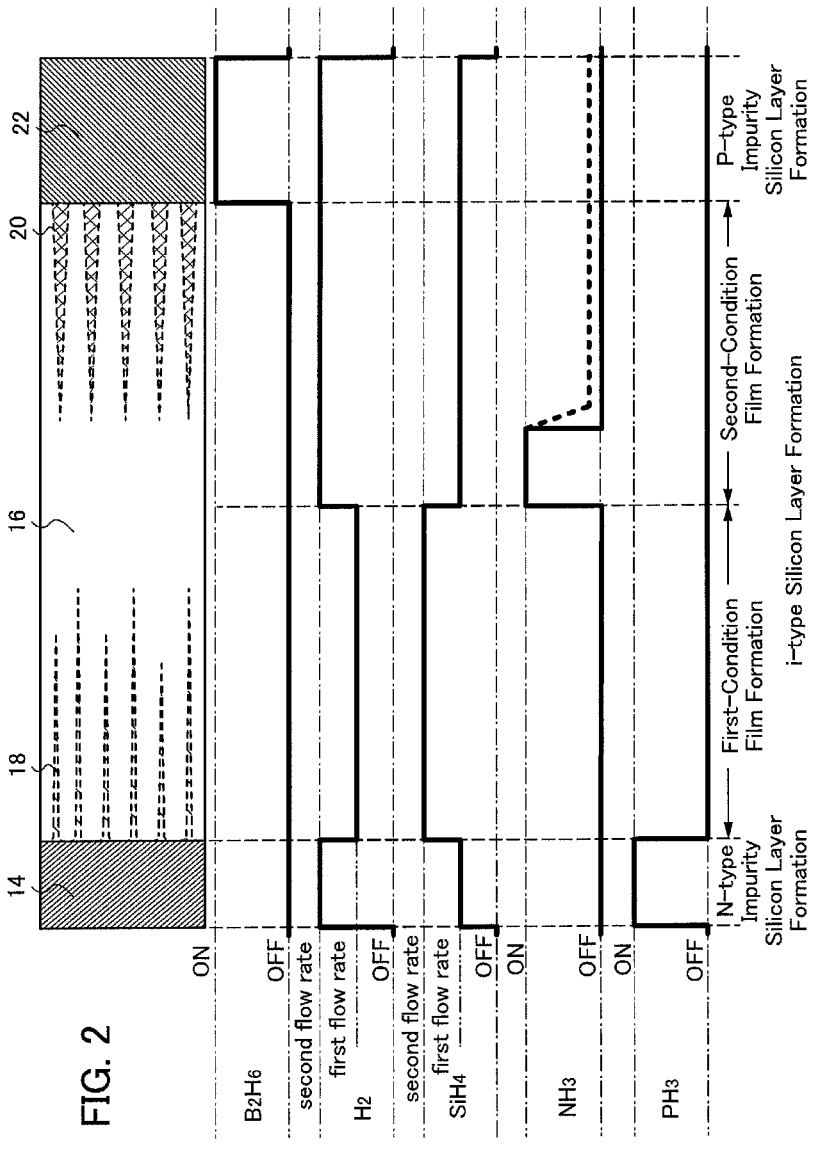
FIG. 2 is a diagram showing one example of the manufacturing method of a photoelectric conversion layer according to one embodiment of the present invention.

Note that the first condition and the second condition shown in FIG. 2 are just an example; there is no limitation on the change of the gas flow ratio, gaseous species, and the like. In order to growth the first crystal regions 18, the flow ratio of the reaction gas introduced at the initial stage of the formation of the second semiconductor layer 16 is controlled so that the flow rate of the dilution gas to the semiconductor source gas is greater than or equal to 1 time and less than or equal to 6 times, and the flow ratio may be changed to that of the second condition, at the stage where the growth of the first crystal regions 18 proceeds. As for the change from the first condition to the second condition, the flow ratio between the semiconductor source gas and the dilution gas may be changed gradually.

Further, it is preferable that the second semiconductor layer 16 is formed without exposure to the air after the first semiconductor layer 14 is formed. This is because formation of a layer of material such as a native oxide film on the interface between the first semiconductor layer 14 and the second semiconductor layer 16 is prevented, so that suppression of the production of the first crystal regions 18 can be prevented.

Further, it is preferable that the oxygen concentration in the reaction space is low. It is preferable that the oxygen concentration is low at least in forming the second semiconductor layer 16.

Through the above-described process, the first semiconductor layer 14, the second semiconductor layer 16, and the third semiconductor layer 22 which form a photoelectric conversion layer are formed.

Although FIG. 1 illustrates the case where an n-i-p junction is formed by a stack-layer structure of the first semiconductor layer 14, the second semiconductor layer 16, and the third semiconductor layer 22, as the structure of the photoelectric conversion layer, an n-i junction, a p-i junction, or a p-n junction may be used instead of this n-i-p junction as the semiconductor junction included in the photoelectric conversion device.

As the substrate 10, a variety of commercial glass plates of soda-lime glass, lead glass, strengthened glass, ceramic glass, or the like can be used. Further, a non-alkali glass substrate such as an aluminosilicate glass substrate or a barium borosilicate glass substrate, a quartz substrate, or a metal substrate such as a stainless steel substrate can be used as well. In the case where the substrate 10 serves as the light incidence plane (main light-receiving plane), a substrate having a light-transmitting property is used as the substrate 10.

In the case where the substrate 10 serves as the light incidence plane, the first electrode 12 is formed using a transparent conductive material such as indium oxide, indium tin oxide (ITO), or zinc oxide, and the second electrode 24 is formed using a conductive material such as aluminum, silver, titanium, or tantalum, preferably, a metal material that can form a reflective electrode. In the case where the second electrode 24 serves as the light incidence plane, the first electrode 12 is formed using a conductive material such as aluminum, silver, titanium, or tantalum and the second electrode 24 is formed using a transparent conductive material. In the case of forming a reflective electrode with the use of a metal material such as aluminum, silver, titanium, or tantalum, as the first electrode 12, it is preferable to make the surface of the first electrode 12 on the side which is in contact with the first semiconductor layer 14 uneven because the reflectivity is increased.

As the transparent conductive material used for forming the first electrode 12 or the second electrode 24, a conductive high molecular material (also called conductive polymer) can also be used instead of metal oxide such as indium oxide, indium tin oxide, or zinc oxide. As the conductive high molecular material, π electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

Figure 3:
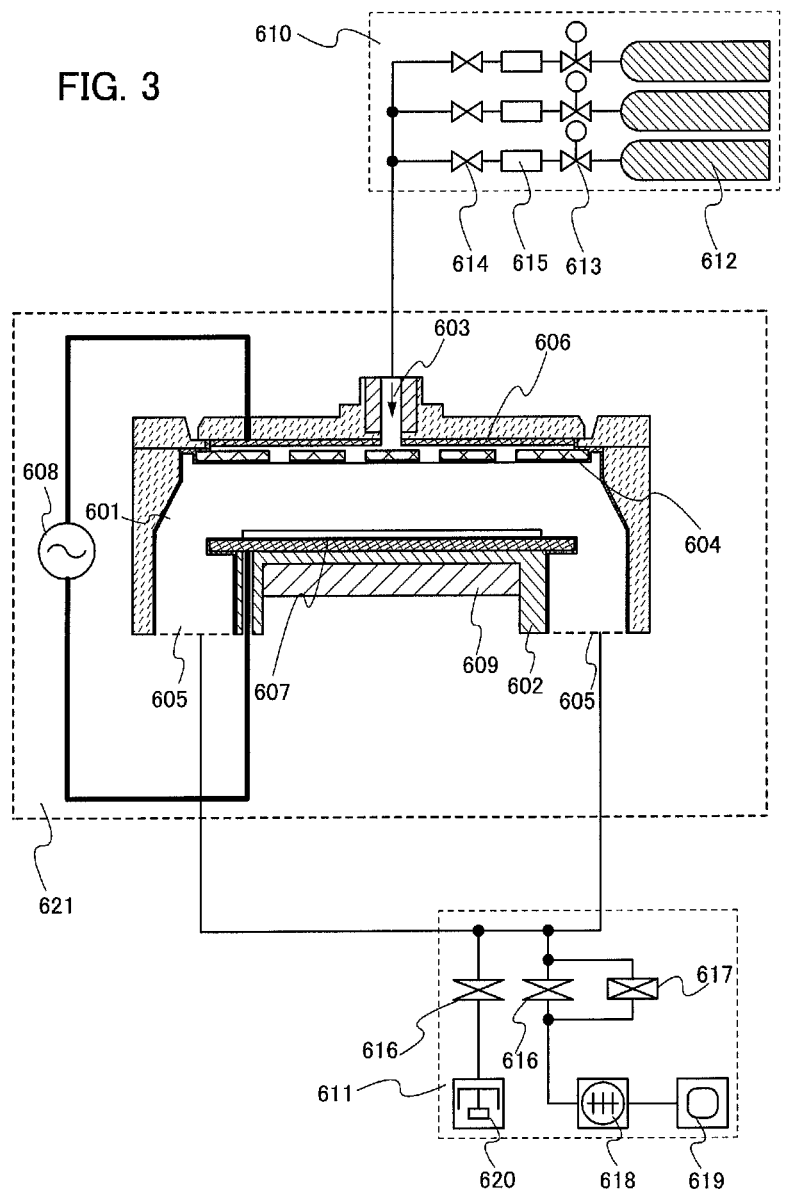
FIG. 3 is a diagram of a plasma CVD apparatus capable of being used for manufacturing a photoelectric conversion device according to one embodiment of the present invention.

Next, an example of a plasma CVD apparatus which is applicable for forming each semiconductor layer of the photoelectric conversion device of Embodiment 1 is illustrated in FIG. 3.

A plasma CVD apparatus 621 illustrated in FIG. 3 is connected to a gas supply means 610 and an exhaust means 611.

The plasma CVD apparatus 621 illustrated in FIG. 3 is equipped with a reaction chamber 601, a stage 602, a gas supply portion 603, a shower plate 604, an exhaust port 605, an upper electrode 606, a lower electrode 607, an AC power source 608, and a temperature control portion 609.

The reaction chamber 601 is formed from a material having rigidity and can be evacuated to vacuum. The reaction chamber 601 is provided with the upper electrode 606 and the lower electrode 607. Although FIG. 3 illustrates a capacitively coupled (parallel flat plate) type structure, another structure such as an inductively coupled type may be employed as long as plasma can be produced in the reaction chamber 601.

When processing is executed with the plasma CVD apparatus illustrated in FIG. 3, a predetermined gas is supplied through the gas supply portion 603. The supplied gas is introduced into the reaction chamber 601 through the shower plate 604. High-frequency power is applied with the AC power source 608 connected to the upper electrode 606 and the lower electrode 607 to excite the gas in the reaction chamber 601, whereby plasma is produced. Further, the gas in the reaction chamber 601 is exhausted through the exhaust port 605 connected to a vacuum pump. Moreover, with the use of the temperature control portion 609, plasma treatment can be performed while the object to be processed is heated.

The gas supply means 610 includes a cylinder 612 which is filled with a reaction gas, a pressure adjusting valve 613, a stop valve 614, a mass flow controller 615, and the like. In the reaction chamber 601, the shower plate 604 which has a plate-like shape and is provided with a plurality of small openings is provided between the upper electrode 606 and the lower electrode 607. A reaction gas that is supplied to the upper electrode 606 passes through a hollow portion in the upper electrode 606, and is supplied into the reaction chamber 601 through the small openings.

The exhaust means 611 that is connected to the reaction chamber 601 has a function of vacuum evacuation and a function of controlling the pressure in the reaction chamber 601 to be maintained at a predetermined level when a reaction gas is introduced. The exhaust means 611 includes a butterfly valve 616, a conductance valve 617, a turbo-molecular pump 618, a dry pump 619, and the like. When the butterfly valve 616 and the conductance valve 617 are provided in parallel, the exhaust velocity of the reaction gas can be controlled to keep the pressure in the reaction chamber 601 to be in a predetermined range by closing the butterfly valve 616 to operate the conductance valve 617. Further, by opening the butterfly valve 616 having higher conductance, high-vacuum evacuation can be performed.

In the case of evacuating the reaction chamber 601 to ultrahigh vacuum of a pressure lower than $10^{-5}$ Pa, a cryopump 620 is preferably used in combination. Alternatively, in the case where the reaction chamber 601 is evacuated to ultrahigh vacuum as ultimate vacuum, the inner wall of the reaction chamber 601 may be polished to be a mirror surface and the reaction chamber 601 may be provided with a heater for baking in order to reduce degassing from the inner wall.

Note that precoating treatment performed so that a film is formed covering the entire inner wall of the reaction chamber 601 as shown in FIG. 3 can prevent an impurity element attached to or included in the inner wall of the reaction chamber from mixing into a film which is to be formed or the like.

Figure 4:
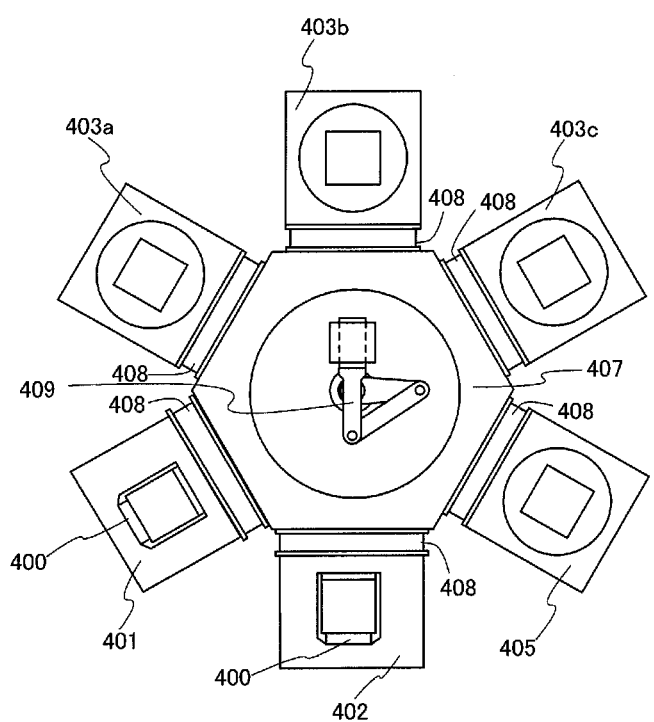
FIG. 4 is a diagram illustrating a structure of a multichamber plasma CVD apparatus provided with a plurality of reaction chambers according to one embodiment of the present invention.

The plasma CVD apparatus illustrated in FIG. 3 can have a multichamber structure as illustrated in FIG. 4. This apparatus illustrated in FIG. 4 includes a load chamber 401, an unload chamber 402, a reaction chamber (1) 403a, a reaction chamber (2) 403b, a reaction chamber (3) 403c, and a spare chamber 405 around a common chamber 407. For example, an n-type semiconductor layer is formed in the reaction chamber (1) 403a, an i-type semiconductor layer is formed in the reaction chamber (2) 403b, and a p-type semiconductor layer is formed in the reaction chamber (3) 403c. An object to be processed is transferred in and out of each reaction chamber through the common chamber 407. A gate valve 408 is provided between the common chamber 407 and each of the other chambers such that treatments performed in different reaction chambers do not interfere with each other. The substrate is disposed at a cassette 400 in the load chamber 401 and in the unload chamber 406 and transferred to the reaction chamber (1) 403a, the reaction chamber (2) 403b, and the reaction chamber (3) 403c by a transfer means 409 of the common chamber 407. In this apparatus, a reaction chamber can be provided for each kind of films to be formed, and a plurality of different kinds of films can be formed in succession without being exposed to the air.

The first impurity semiconductor layer 14 to the third impurity semiconductor layer 22 can be formed with use of plasma produced by a reaction gas introduced into a reaction chamber (reaction space) of a plasma CVD apparatus with the structure as shown in FIG. 3 or FIG. 4.

In the case of forming a photoelectric conversion device having an n-i-p junction, the plasma CVD apparatus is preferably provided with reaction chambers corresponding to an n-type semiconductor layer, an i-type semiconductor layer, and a p-type semiconductor layer.

In this case, first, a first reaction gas is introduced into a reaction chamber (1) into which the substrate 10 provided with the first electrode 12 is transferred as the object to be processed, and plasma is produced, whereby the first impurity semiconductor layer 14 (n-type impurity semiconductor layer) is formed over the first electrode 12 provided over the substrate 10. Next, the substrate 10 provided with the first impurity semiconductor layer 14 is transferred out of the reaction chamber (1) to a reaction chamber (2) without being exposed to the air, a second reaction gas is introduced into the reaction chamber (2), and plasma is produced, whereby the second semiconductor layer 16 (i-type semiconductor layer) is formed over the first impurity semiconductor layer 14. Then, the substrate 10 provided with the second semiconductor layer 16 is transferred out of the reaction chamber (2) to a reaction camber (3) without being exposed to the air, a third reaction gas is introduced to the reaction chamber (3), and plasma is produced, whereby the third impurity semiconductor layer 22 (p-type impurity semiconductor layer) is formed over the second semiconductor layer 16. In FIG. 4, the number of reaction chambers is 3 in accordance with the number of films which are stacked (the first impurity semiconductor layer 14, the second semiconductor layer 16, and the third impurity semiconductor layer 22).

For example, in the case of forming an n-i junction, a p-i junction, or a p-n junction as a photoelectric conversion layer, the number of reaction chambers used for forming semiconductor layers may be 2. In the case of forming layers having the same conductivity type but different concentrations, such as a p-p$^-$-n junction or a p$^+$-p-p$^-$-n junction, the number of reaction chambers may be 4; however, as long as the concentration of the gas containing an impurity element to be introduced into the reaction chamber is controlled, the number of reaction chambers may be 2 in some cases.

Embodiment 2

Figure 5:
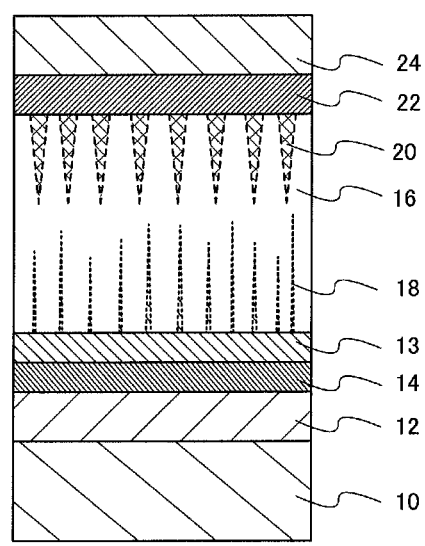
FIG. 5 is a diagram of a photoelectric conversion device according to one embodiment of the present invention.

FIG. 5 illustrates the structure of a photoelectric conversion device according to Embodiment 2. The photoelectric conversion device includes at least one semiconductor junction by a second semiconductor layer 16 of an i-type semiconductor which is interposed between a first semiconductor layer 14 of an n-type semiconductor and a third semiconductor layer 22 of a p-type semiconductor. Shown here is the structure in which a low-concentration impurity semiconductor layer 13 is provided between the first semiconductor layer 14 and the second semiconductor layer 16. The low-concentration impurity semiconductor layer 13 is a semiconductor layer in which an impurity element imparting the same conductivity type as the first semiconductor layer 14 is contained and the impurity concentration is lower than that in the first semiconductor layer 14. Described in Embodiment 2 will be the example in which the low-concentration impurity semiconductor layer 13 is an n-type semiconductor.

The low-concentration impurity semiconductor layer 13 provided between the first semiconductor layer 14 and the second semiconductor layer 16 improves the carrier-transporting property in an interface of a semiconductor junction. In this case, the n-type impurities in the low-concentration impurity semiconductor layer 13 are distributed so that the concentration thereof is decreased in a stepwise manner or continuously from the first semiconductor layer 14 to the second semiconductor layer 16, so that the carrier-transporting property is further improved. Further, this structure decreases the interface state density and improves the diffusion potential, whereby the open-circuit voltage of the photoelectric conversion device is increased. The low-concentration impurity semiconductor layer 13 in such a junction structure is formed using a microcrystalline semiconductor, typically, microcrystalline silicon. By the formation of the low-concentration impurity semiconductor layer 13 of a microcrystalline semiconductor in contact with the second semiconductor layer 16, a needle-like crystal can be grown in the second semiconductor layer 16.

The second semiconductor layer 16 has a structure in which a first crystal region 18 and a second crystal region 20 exist in an amorphous structure, in which the first crystal region 18 exists on the interface side between the low-concentration impurity semiconductor layer 13 and the second semiconductor layer 16 and the second crystal region 20 exists on the interface side between the second semiconductor layer 16 and the third semiconductor layer 22. On the low-concentration impurity semiconductor layer 13, film deposition is performed with the reaction gas with the flow rate of the dilution gas (typically a hydrogen gas) to the semiconductor source gas (typically silane) being greater than or equal to 1 time and less than or equal to 6 times. Subsequently, the flow ratio between the dilution gas and the semiconductor source gas is adjusted to be a mixture ratio capable of production of a microcrystalline semiconductor and an impurity element which interrupts crystal nucleation is contained in a reaction space where the oxygen concentration is low, and film deposition is performed for a while. Then, the concentration of the impurity elements which interrupt crystal nucleation is decreased, which produces crystal nuclei, and crystals are grown from the crystal nuclei. In this manner, the second semiconductor layer 16 in which the first crystal regions 18 grown from the interface between the low-concentration impurity semiconductor layer 13 and the second semiconductor layer 16 in the deposition direction of the second semiconductor layer 16 and the second crystal regions 20 grown from a position which is away from the interface between the low-concentration impurity semiconductor layer 13 and the second semiconductor layer 16 in the deposition direction of the second semiconductor layer 16 are included in an amorphous structure can be formed. Note that the first semiconductor layer 14 may be a p-type semiconductor and the third semiconductor layer 22 may be an n-type semiconductor as well.

As a substrate 10, a variety of kinds of glass plates described in Embodiment 1 can be used. In the case where the substrate 10 serves as a light incidence plane, a first electrode 12 is formed using a transparent conductive material such as indium oxide, indium tin oxide, or zinc oxide as described in Embodiment 1. On the other hand, in the case where the first electrode 12 serves as a reflective electrode, the first electrode 12 is formed using a metal material such as aluminum, silver, titanium, or tantalum described in Embodiment 1. In the case where the first electrode 12 serves as a reflective electrode, it is preferable to make the surface of the first electrode 12 uneven because the reflectivity is improved.

As is in Embodiment 1, the first semiconductor layer 14 is formed using a microcrystalline semiconductor (typically, microcrystalline silicon) containing phosphorus as an impurity element imparting one conductivity type. The low-concentration impurity semiconductor layer 13 is an impurity semiconductor layer formed using a microcrystalline semiconductor (typically, microcrystalline silicon) in which an impurity element imparting the same conductivity type as the first semiconductor layer 14 is contained at a lower concentration than in the first semiconductor layer 14.

As is in Embodiment 1, the second semiconductor layer 16 is substantially an intrinsic semiconductor, in which the first crystal regions 18 and the second crystal regions 20 exist in an amorphous semiconductor (typically, amorphous silicon). In the second semiconductor layer 16, the first crystal regions 18 exist on the interface side between the low-concentration impurity semiconductor layer 13 and the second semiconductor layer 16 and each have a conical or pyramidal structure grown while decreasing its width from the interface between the low-concentration impurity semiconductor layer 13 and the second semiconductor layer 16. Each first crystal region 18 is a crystal region which is grown from the low-concentration impurity semiconductor layer 13 in the deposition direction of the second semiconductor layer 16, using the low-concentration impurity semiconductor layer 13 as a seed crystal. Further, in the second semiconductor layer 16, the second crystal regions 20 exist on the interface side between the second semiconductor layer 16 and the third semiconductor layer 22 and each have a conical or pyramidal structure grown while decreasing its width from the interface between the second semiconductor layer 16 and the third semiconductor layer 22. Each second crystal region 20 is a conical or pyramidal crystal region which is grown while increasing its width from a crystal nucleus which is produced at a position which is away from the interface between the low-concentration impurity semiconductor layer 13 and the second semiconductor layer 16, in the deposition direction of the second semiconductor layer 16 (toward the interface between the second semiconductor layer 16 and the third semiconductor layer 22).

As is in Embodiment 1, a microcrystalline semiconductor or an amorphous semiconductor can be deposited by plasma of a reaction gas in which a semiconductor source gas typified by silane is diluted with a dilution gas typified by a hydrogen gas, introduced into the reaction space. The second semiconductor layer 16 is formed over the low-concentration impurity semiconductor layer 13 by a reaction gas with, at least at the initial stage of deposition, the flow rate of a dilution gas to a semiconductor gas, being greater than or equal to 1 time and less than or equal to 6 times. By controlling the reaction gas in forming the second semiconductor layer 16, specifically, the amount of dilution with the dilution gas, needle-like crystals can be grown in the deposition direction of the second semiconductor layer 16 from the low-concentration impurity semiconductor layer 13. Subsequently, in the second semiconductor layer 16, the flow ratio between the dilution gas and the semiconductor source gas in the reaction gas is adjusted to be a mixture ratio capable of production of a microcrystalline semiconductor and an impurity element (typically nitrogen) which interrupts crystal nucleation is contained in the reaction space, and film deposition is performed for a while. Then, the concentration of the impurity elements which interrupt crystal nucleation is decreased, which produces crystal nuclei, and film deposition is further continued, so that reverse-conical or -pyramidal crystals are grown from a position which is away from the interface between the low-concentration impurity semiconductor layer 13 and the second semiconductor layer 16 toward the interface between the second semiconductor layer 16 and the third semiconductor layer 22, thereby forming the second crystal regions 20.

As is in Embodiment 1, the third semiconductor layer 22 is formed using a microcrystalline semiconductor or an amorphous semiconductor containing boron as an impurity element imparting one conductivity type. A second electrode 24 over the third semiconductor layer 22 is formed using a metal material as is in Embodiment 1. In a case where light enters from the second electrode 24 side, the second electrode 24 is formed using a transparent conductive material.

Although FIG. 5 illustrates the example of the photoelectric conversion device having an n-n⁻-i-p junction where the first semiconductor layer 14, the low-concentration impurity semiconductor layer 13, the second semiconductor layer 16, and the third semiconductor layer 22 are stacked, a photoelectric conversion device having a p-p⁻-i-n junction can be manufactured as well. Further, photoelectric conversion devices having other junctions can be manufactured as well.

Embodiment 3

In Embodiment 3, a so-called stack (including tandem) photoelectric conversion device in which a plurality of unit cells is stacked will be described. Described in Embodiment 3 will be the example of a photoelectric conversion device in which a unit cell including a single crystal semiconductor layer (typically single crystal silicon) and a unit cell including an amorphous semiconductor layer (typically non-single-crystal silicon) are included as a bottom cell and a top cell, respectively.

Figure 6:
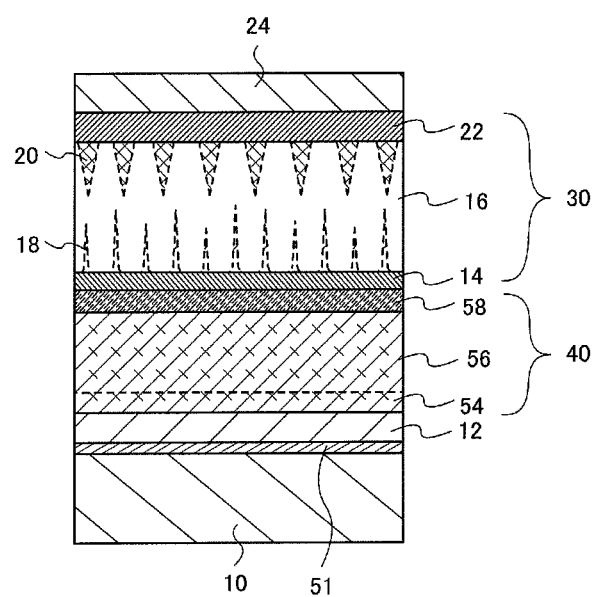
FIG. 6 is a diagram of a photoelectric conversion device according to one embodiment of the present invention.

A photoelectric conversion device shown in FIG. 6 includes a first electrode 12 provided over a substrate 10 with an insulating layer 51 interposed therebetween, a unit cell 40 including a single crystal semiconductor layer, provided over the first electrode 12, a unit cell 30 including a non-single-crystal semiconductor layer, provided over the unit cell 40, and a second electrode 24 provided over the unit cell 30.

The unit cell 30 has a stack-layer structure of the first semiconductor layer 14, the second semiconductor layer 16, and the third semiconductor layer 22 described in Embodiment 1, and the first crystal regions 18 and the second crystal regions 20 are included in an amorphous structure in the second semiconductor layer 16. The first semiconductor layer 14 is an n-type semiconductor and the third semiconductor layer 22 is a p-type semiconductor in Embodiment 3. The unit cell 40 includes the single crystal semiconductor layer, and, for example, has a stack-layer structure of an impurity semiconductor layer 54 having one conductivity type, a single crystal semiconductor layer 56, and an impurity semiconductor layer 58 having a conductivity type opposite to the one conductivity type. In Embodiment 3, the impurity semiconductor layer 54 is an n-type semiconductor, the impurity semiconductor layer 58 is a p-type semiconductor, and the impurity semiconductor layer 58 which is a p-type semiconductor in the unit cell 40 and the first semiconductor layer 14 which is an n-type semiconductor in the unit cell 30 are in contact with each other. A p-n junction is formed at the connection between the unit cell 40 and the unit cell 30.

In Embodiment 3, it is preferable that the single crystal semiconductor layer (typically a single crystal silicon layer) included in the unit cell 40 is formed by slicing a single crystal semiconductor substrate (typically a single crystal silicon substrate). It is preferable that the single crystal semiconductor substrate is sliced by the following method: a method in which irradiation with ions (typically, hydrogen-derived ions such as $H^+$ ions, $H_2^+$ ions, and $H_3^+$ ions) accelerated by voltage by an ion implantation method or an ion doping method and thermal treatment is performed thereon, so that the single crystal semiconductor substrate is divided; or a method in which irradiation is performed with a laser beam which causes multiphoton absorption, so that the single crystal semiconductor substrate is divided. Alternatively, the single crystal semiconductor substrate may be polished to reduce the thickness to a predetermined thickness to be sliced, or an epitaxial growth layer on a porous semiconductor may be separated out.

The thickness of the single crystal semiconductor layer included in the photoelectric conversion layer in the unit cell 40 is 1 to 10 μm, preferably 3 to 5 μm. Note that after the single crystal semiconductor substrate is sliced so that a single crystal semiconductor layer with a predetermined thickness is obtained, the thickness of the single crystal semiconductor layer may be increased by utilizing solid phase growth or vapor phase growth.

For example, the single crystal semiconductor substrate is irradiated with hydrogen ions accelerated by voltage by an ion implantation method to partially form a region where hydrogen is contained at high concentration (hereinbelow also called a fragile layer) and then divided along and from the fragile layer by thermal treatment or the like, whereby a single crystal semiconductor layer can be obtained. Further, after the single crystal semiconductor layer is obtained through the division, a separated substrate that is a single crystal semiconductor substrate remains. The single crystal semiconductor substrate which is the separated substrate can be used repeatedly; and therefore, such a method for dividing a single crystal semiconductor substrate, using an ion implantation method or an ion doping method is preferable in terms of resource saving and cost reduction. Note that also in the case of the method in which irradiation with a laser beam which causes multiphoton absorption is performed, a separated substrate which is a single crystal semiconductor substrate can be obtained and used repeatedly.

It is preferable that a single crystal semiconductor layer which is obtained by slicing a single crystal semiconductor substrate is formed over a supporting substrate. For example, a single crystal semiconductor substrate including a fragile layer is attached to a supporting substrate and thermal treatment is performed thereon, so that part of the single crystal semiconductor substrate fixed to the supporting substrate is separated out along and from the fragile layer, thereby forming a single crystal semiconductor layer over the supporting substrate.

Further, in order to form a photoelectric conversion device, it is preferable to form a single crystal semiconductor layer over an electrode provided for a supporting substrate. For example, a single crystal semiconductor substrate provided with an electrode is attached to a supporting substrate, and then, part of the single crystal semiconductor substrate is separated out, so that a single crystal semiconductor layer is formed over the supporting substrate with the electrode interposed therebetween. The single crystal semiconductor substrate and the supporting substrate can be attached to each other with the electrode used as a binding material; however, it is preferable to attach them to each other on the molecular level with a hydroxyl group, a water molecule, or the like provided as a binding material on the attachment plane (the junction plane). Further, it is preferable that the flatness of the attachment plane is high because solid junction can be formed. In order to improve the flatness, it is also preferable to attach them to each other with an insulating layer interposed therebetween.

FIG. 6 illustrates the case in which an insulating layer 51 is interposed between the first electrode 12 and the substrate 10 and is served as a junction layer. The insulating layer 51 can have either a single-layer structure or a stack-layer structure as long as it can improve the flatness of the junction plane. For example, the insulating layer 51 can be formed by a silicon oxide layer, a silicon nitride layer, a silicon oxynitride layer, a silicon nitride oxide layer, or the like formed by a plasma CVD method using, as a reaction gas, an organosilane gas such as tetraethoxysilane or a silane gas such as silane or disilane.

Further it is preferable that the first electrode 12 is a high-melting-point metal because thermal treatment at a temperature more than or equal to about 400° C. is needed when the single crystal semiconductor substrate is divided along and from the fragile layer. Further, in order to improve the flatness of the attachment plane, it is preferable that the surface of the first electrode 12 is also superior in the flatness. Specifically, it is preferable to form the first electrode 12 with the use of a metal material such as titanium, molybdenum, tungsten, tantalum, chromium, or nickel or a nitride of the metal material. For example, the first electrode 12 can have a stack-layer structure of titanium nitride and titanium stacked on the single crystal semiconductor layer.

An example for forming the unit cell 40 over the substrate 10 will be described below. A single crystal semiconductor substrate, typically a single crystal silicon substrate, is irradiated with hydrogen ions accelerated by voltage to partially form a fragile layer which is a high-concentration-hydrogen region at a predetermined depth of the single crystal silicon substrate. An impurity element imparting one conductivity type (an n-type impurity element in Embodiment 3) is added into one surface of the single crystal silicon substrate, so that the impurity semiconductor layer 54 is formed. On the surface where the impurity semiconductor layer 54 is formed in the single crystal silicon substrate, the first electrode 12 is formed, and the insulating layer 51 is formed over the first electrode 12. The insulating layer 51 and the substrate 10 are placed in contact with each other to form a junction and attach to each other. Thermal treatment is performed thereon to divide the single crystal silicon substrate from and along the fragile layer, so that the single crystal semiconductor layer 56 which is a single crystal silicon layer is formed over the first electrode 12. The single crystal semiconductor layer 56 is provided with the impurity semiconductor layer 54 on the first electrode 12 side. The single crystal semiconductor layer 56 obtained by dividing the single crystal semiconductor substrate may be subjected to thermal treatment or irradiated with a laser beam so that defects caused by damage at the time of division can be repaired.

The impurity semiconductor layer 58 can be formed by adding an impurity element imparting one conductivity type (a p-type impurity element in Embodiment 3) into the single crystal semiconductor layer obtained by slicing or by a plasma CVD method or the like. The impurity semiconductor layer 58 may be formed using a single crystal semiconductor, a microcrystalline semiconductor, or an amorphous semiconductor.

Over the impurity semiconductor layer 58, the first semiconductor layer 14, the second semiconductor layer 16, the third semiconductor layer 22, and the second electrode 24 are formed in a similar manner to Embodiment 1, so that a photoelectric conversion device according to this embodiment can be manufactured.

In this embodiment, a unit cell including a single crystal semiconductor layer and a unit cell including a non-single-crystal semiconductor layer are stacked, whereby unit cells having different bandgaps can be stacked. Further, provision of the unit cell including a single crystal semiconductor layer, typically a single crystal silicon layer, as a bottom cell allows long-wavelength light with a wavelength of 800 nm or more to be converted into electricity. Accordingly, the light absorption wavelength range of the photoelectric conversion device can be widen, and change of the characteristics due to photodegradation of a top cell where short-wavelength light is converted into electricity is suppressed according to one embodiment of the present invention; therefore, photoelectric conversion characteristic can be improved.

Embodiment 4

An example of an integrated photoelectric conversion device in which a plurality of unit cells is formed over the same substrate and is connected in series so that a photoelectric conversion device is integrated will be described in Embodiment 4. The process for manufacturing the integrated photoelectric conversion device and the rough structure thereof will be described below.

Figure 7:
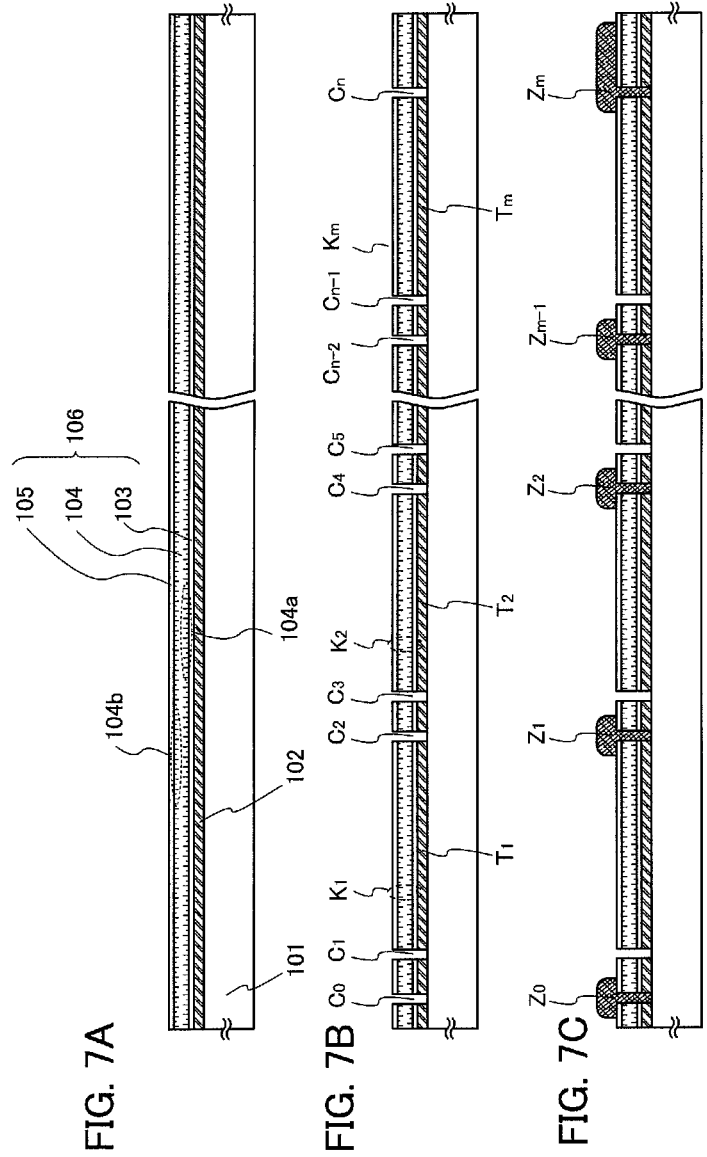
FIGS. 7A to 7C are cross-sectional diagrams showing a manufacturing process of an integrated photoelectric conversion device according to one embodiment of the present invention.

In FIG. 7A, a first electrode layer 102 is provided over a substrate 101. Alternatively, the substrate 101 provided with the first electrode layer 102 is prepared. The first electrode layer 102 is formed to a thickness of 40 to 200 nm (preferably 50 to 100 nm) using a transparent conductive material such as indium oxide, indium tin oxide, zinc oxide, tin oxide, or alloy of indium-tin oxide and zinc oxide. The sheet resistance of the first electrode layer 102 may be about 20 to 200 Ω/square.

The first electrode layer 102 can be formed using a conductive high molecular material. When a thin film of a conductive high molecular material is formed as the first electrode layer 102, the thin film preferably has a sheet resistance of 10000 Ω/square or less and a light transmittance of 70% or more with respect to light with a wavelength of 550 nm. Note that the resistivity of the conductive high molecule included in the first electrode layer 102 is preferably 0.1Ω·cm or less. As the conductive high molecule, a so-called π-electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

Specific examples of the conjugated conductive high-molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above-described conductive high molecule may be used alone as the conductive high molecular material to form the first electrode layer 102. An organic resin may be added in order to adjust the properties of the conductive high molecular material.

As for the organic resin added to adjust the properties of the conductive high molecular material, any of a thermosetting resin, a thermoplastic resin, or a photocurable resin may be used as long as the resin can be dissolved or mixed and dispersed into the conductive high molecule. For example, the following can be used: a polyester-based resin such as polyethylene terephthalate, polybutylene terephthalate, or polyethylene naphthalate; a polyimide-based resin such as polyimide or polyamide-imide; a polyamide resin such as polyamide 6, polyamide 66, polyamide 12, or polyamide 11; a fluorine resin such as polyvinylidene fluoride, polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin; a copolymer of any of those resins; or the like.

Further, the oxidation reduction potential of a conjugated electron of the conjugated conductive high molecule may be changed by adding an impurity serving as an acceptor or a donor to the conductive high molecular material, so that the electric conductivity of the first electrode layer 102 can be adjusted.

As the impurity serving as an acceptor, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound in which two or more cyano groups are included in a conjugated bond can be used; for example, tetracyanoethylene, tetracyanoethylene oxide, tetracyanobenzene, tetracyanoquinodimethane, and tetracyanoazanaphthalene are given.

As examples of the impurity serving as a donor, alkali metal, alkaline-earth metal, a quaternary amine compound, and the like can be given.

Further, a thin film used as the first electrode layer 102 can also be formed by a wet process using a solution in which a conductive high molecule is dissolved in water or an organic solvent (e.g., an alcohol solvent, a ketone solvent, an ester solvent, a hydrocarbon solvent, or an aromatic solvent). There is no particular limitation on the solvent for dissolving the conductive high molecule as long as it can dissolve a high molecular resin compound such as the above-described conductive high molecule or organic resins. For example, any one of or a mixture of water, methanol, ethanol, propylene carbonate, N-methylpyrrolidone, N,N-dimethylformamide, N,N-dimethylacetamide, cyclohexanone, acetone, methyl ethyl ketone, methyl isobutyl ketone, toluene, and the like may be used as the solvent.

The film using the conductive high molecular material can be formed by a wet process such as a coating method, a droplet discharge method (also referred to as an inkjet method), or a printing method after dissolved in a solvent as disclosed above. The solvent that dissolves the conductive high molecular material may be vaporized by thermal treatment or thermal treatment under reduced pressure. In the case where the organic resin added to the conductive high molecular material is a thermosetting resin, heat treatment may be performed further. In the case where the organic resin is a photocurable resin, light irradiation treatment may be performed.

Further alternatively, the first electrode layer 102 can be formed using a transparent conductive material, which is a composite material including an organic compound and an inorganic compound having an electron-accepting property to the organic compound. With the composite material including a first organic compound and a second inorganic compound having an electron-accepting property to the first organic compound, the resistivity can be decreased to $1 \times 10^6$ Ω·cm or less. Note that the "composition" means not only the state where a plurality of materials is just mixed but also the state where charges are transported between materials by the mixture.

As the organic compound used for the composite material, a variety of compounds can be used such as an aromatic amine compound, a carbazole derivative, aromatic hydrocarbon, and a high molecular compound (oligomer, dendrimer, polymer, or the like). The organic compound used for the composite material is preferably an organic compound having a high hole-transporting property. Specifically, a substance having a hole mobility of $10^{-6}$ cm$^2$/Vsec or more is preferably used. However, another substance may be employed as long as the hole-transporting property is higher than the electron-transporting property.

Specifically, as the organic compound used for the composite material, the following compounds are given, for example: 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); and the like.

Further, as for the organic compound, when any of the organic compounds described below is used, a composite material that does not have an absorption peak in a wavelength region of 450 to 800 nm can be obtained. In addition, the resistivity can be decreased to $1 \times 10^6$ Ω·cm or less, typically, $5 \times 10^4$ to $1 \times 10^6$ Ω·cm.

As the composite material that does not have an absorption peak in a wavelength region of 450 to 800 nm, the following aromatic amine compounds can be given: N,N'-di(p-tolyl)-N, N'-diphenyl-p-phenylenediamine (abbreviation: DTDPPA);

4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

Further, as the composite material that does not have an absorption peak in a wavelength region of 450 to 800 nm, the following carbazole derivatives can be given specifically: 3-[N-(9-phenylcarbazole-3-yl)-N-phenylamino]-9-phenylcarbazole (abbreviation: PCzPCA1); 3,6-bis[N-(9-phenylcarbazole-3-yl)-N-phenylamino]-9-phenylcarbazole (abbreviation: PCzPCA2); 3-[N-(1-naphtyl)-N-(9-phenylcarbazole-3-yl)amino]-9-phenylcarbazole (abbreviation: PCzPCN1); and the like. Alternatively, the following carbazole derivative can be used: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; or the like.

Further, as the composite material that does not have an absorption peak in a wavelength region of 450 to 800 nm, the following aromatic hydrocarbon is given, for example: 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; or the like. As well as these compounds, pentacene, coronene, or the like can be used. It is particularly preferable to use aromatic hydrocarbon which has a hole mobility of $1 \times 10^{-6}$ cm$^2$/Vsec or more and has 14 to 42 carbon atoms.

The aromatic hydrocarbon that can be used for the composite material that does not have an absorption peak in a wavelength region of 450 to 800 nm may have a vinyl skeleton. As the aromatic hydrocarbon having a vinyl skeleton, the following can be given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Further alternatively, a high molecular compound such as poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA) can be used.

As the inorganic compound used for the composite material, an oxide of a transition metal is preferably used. Moreover, an oxide of a metal element belonging to any of Group 4, Group 5, Group 6, Group 7, or Group 8 in the periodic table is preferably used. Specifically, vanadium oxide, niobium oxide, tantalum oxide, chromium oxide, molybdenum oxide, tungsten oxide, manganese oxide, and rhenium oxide are preferable because of a high electron accepting property. Among these, molybdenum oxide is particularly preferable because it is stable even in the air, has a low moisture absorption property, and is easily treated.

In the method for manufacturing the first electrode layer 102 with use of the composite material, any process may be employed whether it is a dry process or a wet process. For example, the first electrode layer 102 including the composite material can be formed by co-evaporation of the aforementioned organic compound and inorganic compound. In the case of forming the first electrode layer 102 using molybdenum oxide, an evaporation method is preferably employed from the point of the manufacturing process, because molybdenum oxide is easy to evaporate in vacuum. Further, the first electrode layer 102 can also be formed in such a way that a solution including the above organic compound and metal alkoxide is coated and baked. As the method for coating, an ink-jet method, a spin-coating method, or the like can be used.

By selecting the kind of the organic compound in the composite material used for the first electrode layer 102, the composite material that does not have an absorption peak in a wavelength region of 450 to 800 nm can be obtained. Accordingly, light such as solar light can be efficiently transmitted without absorption, so that light collection efficiency can be improved. Further, the first electrode layer 102 formed using the composite material is resistant to bending. Therefore, in the case of manufacturing the photoelectric conversion device with use of a flexible substrate, the use of the composite material for forming the first electrode layer 102 is effective.

From the point of decrease in resistance of the first electrode layer 102, the use of ITO is preferable. In this case, in order to prevent deterioration of an ITO film, it is effective to form a $SnO_2$ film or a ZnO film over the ITO film. A ZnO (ZnO:Ga) film containing gallium (Ga) by 1 to 10 wt % has a high transmittance and is suitable to be stacked over the ITO film. With respect to a combination thereof, for example, the first electrode layer 102 is formed using an ITO film with a thickness of 50 to 60 nm and a ZnO:Ga film with a thickness of 25 nm provided over the ITO film, by which favorable light transmittance can be obtained. The sheet resistance of the stack of the ITO film and the ZnO:Ga film is 120 to 150 Ω/square.

A photoelectric conversion layer 106 is formed using a semiconductor manufactured by a plasma CVD method, and includes a microcrystalline semiconductor and an amorphous semiconductor. A typical example of the microcrystalline semiconductor is microcrystalline silicon manufactured using a reaction gas in which an $SiH_4$ gas is diluted with a hydrogen gas; and as well as such microcrystalline silicon, microcrystalline silicon-germanium or microcrystalline silicon-carbide can be used. A typical example of the amorphous semiconductor is amorphous silicon manufactured using an $SiH_4$ gas as a reaction gas; and as well as such amorphous silicon, amorphous silicon-carbide or amorphous germanium can be used. The photoelectric conversion layer 106 includes any semiconductor junction of a p-i-n junction, a p-i junction, an i-n junction, or a p-n junction.

Illustrated in FIG. 7A is the structure in which in the photoelectric conversion layer 106, a first semiconductor layer 103 formed using an n-type microcrystalline semiconductor, a second semiconductor layer 104 formed using an i-type semiconductor, and a third semiconductor layer 105 formed using a p-type microcrystalline semiconductor are stacked on the first electrode layer 102. The thickness of the photoelectric conversion layer 106 is 0.5 to 10 μm, preferably 1 to 5 μm. Further, in the photoelectric conversion layer 106, the first semiconductor layer 103 can be formed to have a thickness of 10 to 20 nm and the third semiconductor layer 105 can be formed to have a thickness of 20 to 60 nm.

In the second semiconductor layer 104, first crystal regions 104a exist discretely on the interface side between the first semiconductor layer 103 and the second semiconductor layer 104, and second crystal regions 104b exist discretely on the interface side between the second semiconductor layer 104 and the third semiconductor layer 105. At the initial stage of forming the second semiconductor layer 104, the first crystal regions 104a can be grown from the interface between the first semiconductor layer 103 and the second semiconductor layer 104 in the deposition direction of the second semiconductor layer 104 by a reaction gas with the flow rate of the dilution gas to the semiconductor source gas, being greater than or equal to 1 time and less than or equal to 6 times, introduced into a reaction space to deposit a film on the first semiconductor layer 103 formed using a microcrystalline semiconductor. Then, the flow ratio between the dilution gas and the semiconductor source gas is adjusted to be a mixture ratio capable of production of a microcrystalline semiconductor, by which plasma is produced, an impurity element which interrupts crystal nucleation is contained in the reaction space in which the oxygen concentration is low, and film deposition is performed for a while. After that, the concentration of the impurity elements which interrupt crystal nucleation is decreased, which produces crystal nuclei in the second semiconductor layer 16, and film deposition is further continued, thereby growing the second crystal regions 104b from the crystal nuclei. The second crystal regions 104b can be grown from the crystal nuclei produced away from the interface between the first semiconductor layer 103 and the second semiconductor layer 104 by adjusting the concentration of the impurity elements which interrupt crystal nucleation. That is, the second semiconductor layer 104 can include the first crystal regions 104a grown from the interface between the first semiconductor layer 103 and the second semiconductor layer 104 and the second crystal regions 104b grown from the position away from the interface between the first semiconductor layer 103 and the second semiconductor layer 104.

When the second semiconductor layer 104 is formed, the mixture ratio (flow ratio) between the semiconductor source gas and the dilution gas is controlled during the film deposition in order to grow the first crystal regions 104a and the second crystal regions 104b. Further, in order to grow the second crystal regions 104b, the concentrations of the impurity element (typically nitrogen) which interrupts crystal nucleation and oxygen are also controlled. There is no particular limitation on the timing when the flow ratio of the reaction gas is adjusted to the mixture ratio capable of production of a microcrystalline semiconductor as long as it is after the start of the crystal growth of the first crystal regions 104a.

As illustrated in FIG. 7B, in order to form a plurality of unit cells over one substrate, openings $C_0$ to $C_n$ are formed by laser processing to penetrate through the photoelectric conversion layer 106 and the first electrode layer 102. The openings $C_0$, $C_2$, $C_4$, ... $C_{n-2}$, and $C_n$ are provided for insulation, by which a plurality of unit cells is separated for each element. The openings $C_1$, $C_3$, $C_5$, $C_{n-1}$ are provided for connection between the separated first electrode and second electrode which is later formed over the photoelectric conversion layer 106. By the formation of the openings $C_0$ to $C_n$, the first electrode layer 102 is divided into first electrodes $T_1$ to $T_m$ and the photoelectric conversion layer 106 is divided into photoelectric conversion layers $K_1$ to $K_m$. There is no limitation on the kind of lasers used in the laser processing for forming the openings; however, an Nd-YAG laser, an excimer laser, or the like is preferably used. In any case, when the laser processing is performed on the stack of the first electrode layer 102 and the photoelectric conversion layer 106, it is possible to prevent the first electrode layer 102 from separating from the substrate 101 during the processing.

As illustrated in FIG. 7C, insulating resin layers $Z_0$ to $Z_m$ are formed so as to fill the openings $C_0$, $C_2$, $C_4$, ... $C_{n-2}$, and $C_n$ and cover upper end portions of the openings $C_0$, $C_2$, $C_4$, ... $C_{n-2}$, and $C_n$. The insulating resin layers $Z_0$ to $Z_m$ may be formed using a resin material having an insulating property such as an acrylic-based resin, a phenol-based resin, an epoxy-based resin, or a polyimide-based resin by a screen printing method. For example, an insulating resin pattern is formed by a screen printing method so that the openings $C_0$, $C_2$, $C_4$, ..., $C_{n-2}$, and $C_n$ are filled with a resin composition in which cyclohexane, isophorone, high resistance carbon black, aerosil, a dispersing agent, a defoaming agent, and a leveling agent are mixed with a phenoxy resin. After the insulating resin pattern is formed, thermal hardening is performed in an oven for 20 minutes at 160° C. to form the insulating resin layers $Z_0$ to $Z_m$.

Figure 8:
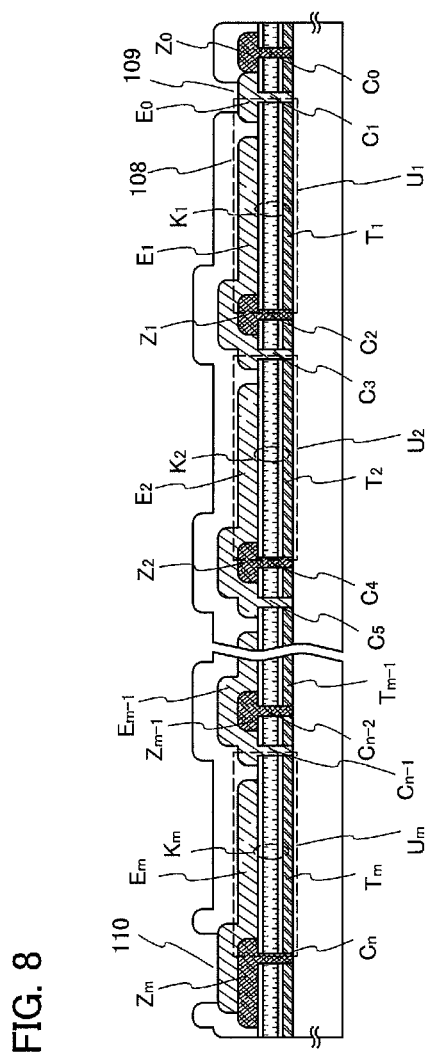
FIG. 8 is a cross-sectional diagram showing the manufacturing process of the integrated photoelectric conversion device according to one embodiment of the present invention.

Next, second electrodes $E_0$ to $E_m$ shown in FIG. 8 are formed. The second electrodes $E_0$ to $E_m$ are formed using a conductive material. The second electrodes $E_0$ to $E_m$ can be formed using a conductive layer of aluminum, silver, molybdenum, titanium, chromium, or the like by a sputtering method or a vacuum evaporation method or can be formed using a conductive material by a discharging method. In the case where the second electrodes $E_0$ to $E_m$ are formed using a conductive material by a discharging method, a predetermined pattern is directly formed by a screen printing method, an ink-jet method, a dispenser method, or the like. For example, the second electrodes $E_0$ to $E_m$ can be formed using a conductive material including conductive particles of metal such as Ag, Au, Cu, W, or Al as the main component. In the case of manufacturing the photoelectric conversion device with a large-area substrate, it is preferable that the resistance of the second electrodes $E_0$ to $E_m$ is low. A conductive material in which a metal particle of gold, silver, or copper, the resistivity of which is low, is dissolved or dispersed in a solvent is preferably used as a main material of the conductive composition. More preferably, silver or copper, the resistance of which is low, is used. In order to sufficiently fill the laser-processed openings $C_1$, $C_3$, $C_5$, ... $C_{n-1}$ with the conductive material, nanopaste including conductive particles with an average diameter of 5 to 10 nm is preferably used.

Alternatively, the second electrodes $E_0$ to $E_m$ may be formed by discharging a conductive material including a conductive particle whose periphery is covered with another conductive material. For example, a conductive particle of Cu whose periphery is covered with Ag, which has a buffer layer formed of Ni or NiB (nickel boron) between Cu and Ag, may be used. As the solvent, esters such as butyl acetate, alcohols such as isopropyl alcohol, an organic solvent such as acetone, or the like can be used. The surface tension and viscosity of the conductive material which is discharged are adjusted as appropriate by controlling the concentration of the solution and adding a surface active agent or the like.

The diameter of a nozzle used in an ink-jet method is preferably set at 0.02 to 100 μm (more preferably, 30 μm or less), and the amount of the conductive material to be discharged from the nozzle is preferably set at 0.001 to 100 pl (more preferably, 10 pl or less). Although the ink-jet method has two types, an on-demand type and a continuous type, either type may be used. Further, as for the nozzle used in an ink-jet method, there are a piezoelectric type utilizing a property of a piezoelectric substance that the shape of the substance changes by voltage application and a heating type in which a material to be discharged (here the conductive material) is boiled by a heater provided in the nozzle and then discharged, and either of them may be used. It is preferable that the distance between an object to be processed and an outlet of the nozzle be as short as possible in order to drop a droplet on a predetermined position. The distance is preferably set at about 0.1 to 3 mm (more preferably 1 mm or less). One of the nozzle and the object to be processed moves while the relative distance therebetween is kept, so that a predetermined pattern can be drawn.

The step of discharging the conductive material may be performed under reduced pressure. This is because the discharge of the conductive material under reduced pressure makes the solvent in the conductive material to vaporize before the discharged conductive material reaches the object to be processed, so that later steps of drying and baking can be eliminated or shortened. In addition, when a gas in which 10% to 30% of oxygen in a partial pressure ratio is mixed is used in a baking step of the composition containing the conductive material, the resistivity of the conductive layer which forms the second electrodes $E_0$ to $E_m$ can be reduced and the conductive layer can be thinned and smoothened.

After the composition which forms the second electrodes $E_0$ to $E_m$ is discharged, either one of or both a drying step and a baking step are performed under an atmospheric pressure or a reduced pressure by laser irradiation, rapid thermal annealing (RTA), heating in a furnace, or the like. Both the drying and baking steps are heat treatment steps; and for example, drying is performed at 100° C. for 3 minutes and baking is performed at 200° C. to 350° C. for 15 to 120 minutes. Through this process, fusion and welding are accelerated by hardening and shrinking a peripheral resin by the solvent which is volatilized in the composition or the dispersant which is chemically removed in the composition is chemically removed. The drying and baking are performed in an oxygen atmosphere or a nitrogen atmosphere, or in the air atmosphere. Note that an oxygen atmosphere is preferable because the solvent in which conductive particles are dissolved or dispersed is easily removed.

Nanopaste has conductive particles each having a diameter of 5 to 10 nm, typified by nanoparticles, dispersed or dissolved in an organic solvent, and dispersant and a thermal hardening resin which is referred to as a binder are also included. A binder has a function of preventing crack or uneven baking during the baking. By the drying or baking step, vaporization of the organic solvent, decomposition removal of the dispersant, and the hardening and shrinking by the binder concurrently proceed; accordingly, the nanoparticles are fused and/or welded to each other to be hardened. Through the drying or baking step, the nanoparticle is grown to a size of several tens of nanometers to a hundred and several tens of nanometers. Adjacent growing nanoparticles are fused and/or welded to each other to be linked, thereby forming a metal hormogone. On the other hand, most of the remaining organic constituents (about 80 to 90%) are pushed out of the metal hormogone; consequently, a conductive layer containing the metal hormogone and a film including an organic constituent that covers an outer side thereof are formed. The film including an organic constituent can be removed in baking the nanopaste in an atmosphere containing nitrogen and oxygen by reaction of oxygen contained in the atmospheric air and carbon, hydrogen, or the like contained in the film including an organic constituent. In addition, in the case where oxygen is not contained in the baking atmosphere, the film including an organic constituent can be removed by separately performing oxygen plasma treatment or the like.

Specifically, the film including an organic constituent is removed by performing oxygen plasma treatment on the nanopaste in an atmosphere including nitrogen and oxygen after the drying or baking. As a result, the remaining conductive layer including the metal hormogone can be smoothened, thinned, and made low resistant. Note that, since the solvent in the composition is volatilized by discharging the composition containing a conductive material under reduced pressure, time of subsequent heat treatment (drying or baking) can be shortened.

The second electrodes $E_0$ to $E_m$ are in contact with the third semiconductor layer 105 in the photoelectric conversion layer 106. The contact resistance between the third semiconductor layer 105 and the second electrodes $E_0$ to $E_m$ can be decreased by forming the contact therebetween to be ohmic contact. The contact resistance can be further decreased by forming the third semiconductor layer 105 using a microcrystalline semiconductor to have a thickness of 30 to 80 nm.

The second electrodes $E_0$ to $E_m$ are connected to the first electrodes $T_1$ to $T_m$ through their respective openings $C_1$, $C_3$, $C_5$, ... $C_{n-1}$. That is, the openings $C_1$, $C_3$, $C_5$, ... $C_{n-1}$ are filled with the same material as the material of the second electrodes $E_0$ to $E_m$. In such a manner, for example, the second electrode $E_1$ is electrically connected to the first electrode $T_2$ and the second electrode $E_{m-1}$ can be electrically connected to the first electrode $T_m$. In other words, the second electrode can be electrically connected to the first electrode adjacent to the second electrode, and the photoelectric conversion layers $K_1$ to $K_m$ are electrically connected in series.

A sealing resin layer 108 is formed using an epoxy resin, an acrylic resin, or a silicone resin. The sealing resin layer 108 is provided with an opening 109 and an opening 110 over the second electrode $E_0$ and the second electrode $E_m$, respectively, so that connection with external wirings can be achieved at the openings 109 and 110.

In this manner, a unit cell $U_1$ including the first electrode $T_1$, the photoelectric conversion layer $K_1$, and the second electrode $E_1$ ... a unit cell $U_m$ including the first electrode $T_m$, the photoelectric conversion layer $K_m$, and the second electrode $E_m$ are formed over the substrate 101. The first electrode $T_m$ is connected to the adjacent second electrode $E_{m-1}$ at the opening $C_{n-1}$ and m unit cells are electrically connected to each other in series in the completed photoelectric conversion device. Note that the second electrode $E_0$ serves as an extraction electrode of the first electrode $T_1$ in the unit cell $U_1$.

Figure 9:
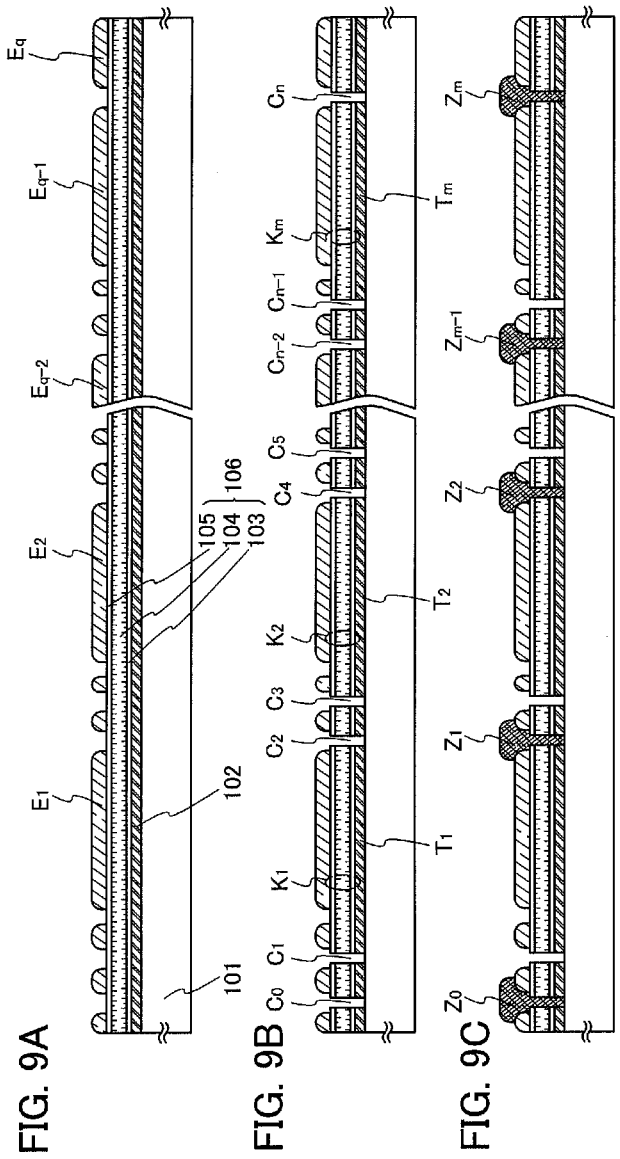
FIGS. 9A to 9C are cross-sectional diagrams showing a manufacturing process of an integrated photoelectric conversion device according to one embodiment of the present invention.

FIGS. 9A to 9C and FIG. 10 illustrate another embodiment of the photoelectric conversion device of Embodiment 4. In FIG. 9A, a substrate 101, a first electrode layer 102, and a photoelectric conversion layer 106 are formed in a similar manner to the above. Then, second electrodes $E_1$ to $E_q$ are formed over the photoelectric conversion layer 106 by a printing method.

As illustrated in FIG. 9B, openings $C_0$ to $C_n$ are formed through the photoelectric conversion layer 106 and the first electrode layer 102 by a laser processing method. The openings $C_0$, $C_2$, $C_4$, ... $C_{n-2}$, and $C_n$ are provided for insulation in forming unit cells, whereas the openings $C_1$, $C_3$, $C_5$, ... $C_{n-1}$ are provided for connection between the first electrodes and the second electrodes $E_1$ to $E_q$ which include the photoelectric conversion layer 106 interposed therebetween. By the openings $C_0$ to $C_n$, the first electrode layer 102 is divided into first electrodes $T_1$ to $T_m$ and the photoelectric conversion layer 106 is divided into photoelectric conversion layers $K_1$ to $K_m$. With the laser processing, a residue remains at the periphery of the opening in some cases. This residue is formed by a spray of a material subjected to processing and is actually undesirable because the spray heated up to a high temperature by a laser beam adheres to the surface of the photoelectric conversion layer 106 and damages the film. In order to prevent the spray from adhering to the surface etc., the second electrodes are formed in accordance with the pattern of the openings and then the laser processing is performed; accordingly, damage at least to the photoelectric conversion layer 106 can be prevented.

As illustrated in FIG. 9C, insulating resin layers $Z_0$ to $Z_m$ which fill the openings $C_0, C_2, C_4, \ldots C_{n-2}$, and $C_n$ and which cover upper end portions of the openings $C_0, C_2, C_4, \ldots C_{n-2}$, and $C_n$ are formed by a printing method, for example, a screen printing method.

Figure 10:
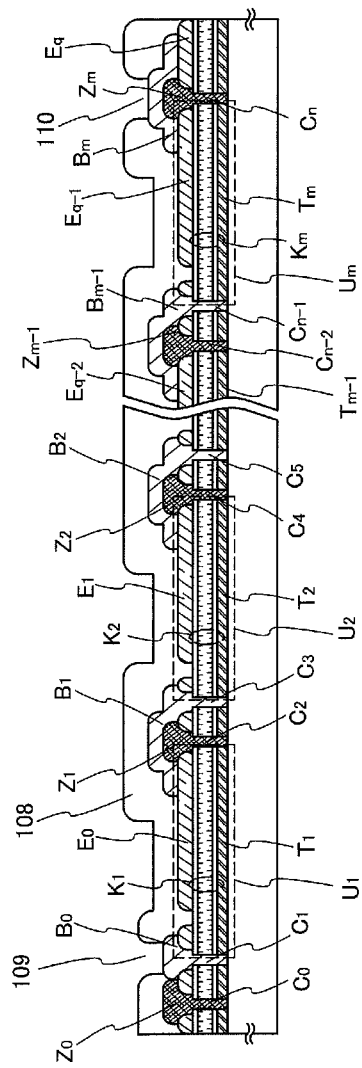
FIG. 10 is a cross-sectional diagram showing the manufacturing process of the integrated photoelectric conversion device according to one embodiment of the present invention.

Next, as illustrated in FIG. 10, wirings $B_0$ to $B_m$ which fill the openings $C_1, C_3, C_5, \ldots C_{n-1}$ and which are connected to the first electrodes $T_1$ to $T_m$ are formed by a screen printing method. The wirings $B_0$ to $B_m$ are formed using the same material as the second electrodes; a thermosetting carbon paste is used here. Note that the wiring $B_m$ is formed over the insulating resin layer $Z_m$ and serves as an extraction wiring. In such a manner, for example, the second electrode $E_0$ can be electrically connected to the first electrode $T_2$ and the second electrode $E_{q-2}$ can be electrically connected to the first electrode $T_m$. That is, the second electrode can be electrically connected to the adjacent first electrode, so that the photoelectric conversion layers $K_1$ to $K_m$ can be electrically connected to each other in series.

Lastly, a sealing resin layer 108 is formed by a printing method. In the sealing resin layer 108, openings 109 and 110 are formed over the wirings $B_0$ and $B_m$ respectively, and the wirings are connected to an external circuit at these openings. In this manner, a unit cell $U_1$ including the first electrode $T_1$, the photoelectric conversion layer $K_1$, and the second electrode $E_0, \ldots$, and a unit cell $U_m$ including the first electrode $T_m$, the photoelectric conversion layer $K_m$, and the second electrode $E_{q-1}$ are formed over the substrate 101. The first electrode $T_m$ is connected to the adjacent second electrode $E_{q-2}$ at the opening $C_{n-1}$ and m unit cells are electrically connected to each other in series in the completed photoelectric conversion device. Note that the wiring $B_0$ serves as an extraction electrode of the first electrode $T_1$ in the unit cell $U_1$.

The integrated photoelectric conversion device according to one embodiment of the present invention includes a layer serve as the main layer which performs photoelectric conversion, including in an amorphous structure, a plurality of crystal regions; therefore, variation in characteristics due to photodegradation can be suppressed to improve the photoelectric conversion characteristic. Further, the main layer which performs photoelectric conversion is formed using an amorphous structure, the light absorption coefficient can be maintained and the thickness of the layer can be reduced to be the same or substantially the same as that of a photoelectric conversion layer of a photoelectric conversion device using an amorphous silicon thin film; therefore, the productivity can also be improved.

Embodiment 5

Embodiment 5 will describe an example of a photosensor device as another embodiment of the photoelectric conversion device.

Figure 11:
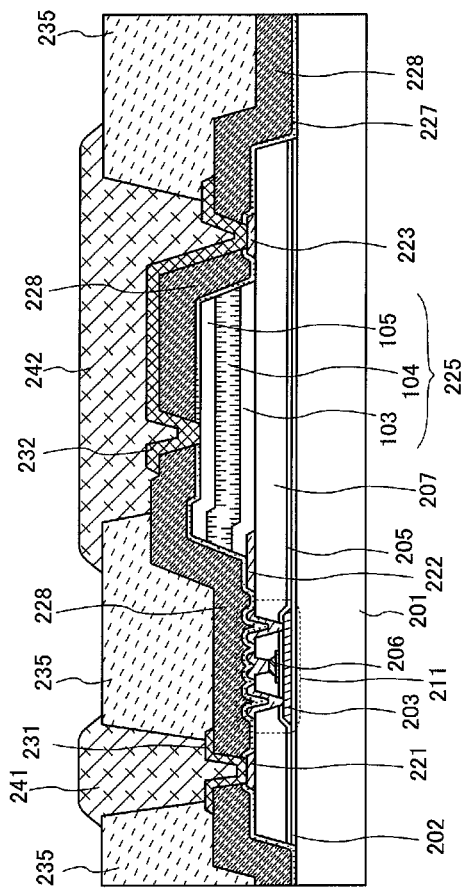
FIG. 11 is a diagram of a light sensor to which a photoelectric conversion layer is applied, according to one embodiment of the present invention.

FIG. 11 illustrates a photosensor device according to Embodiment 5. The photosensor device illustrated in FIG. 11 includes a photoelectric conversion layer 225 in a light-receiving portion and is provided with a function in which an output from the photoelectric conversion layer 225 is amplified by an amplifier circuit including a thin film transistor 211 and then output. The photoelectric conversion layer 225 and the thin film transistor 211 are provided over a substrate 201. As the substrate 201, a light-transmitting substrate, for example, any of a glass substrate, a quartz substrate, a ceramic substrate, or the like can be used.

An insulating layer 202 is formed using one layer or plural layers of silicon oxide, silicon nitride oxide, silicon nitride, or silicon oxynitride is provided over the substrate 201 by a sputtering method or a plasma CVD method. The insulating layer 202 is provided for relieving stress and preventing impurity contamination. A crystalline semiconductor layer 203 of the thin film transistor 211 is provided over the insulating layer 202. A gate insulating layer 205 and a gate electrode 206 are provided over the crystalline semiconductor layer 203, whereby the thin film transistor 211 is formed.

An interlayer insulating layer 207 is provided over the thin film transistor 211. The interlayer insulating layer 207 may be a single insulating layer or a stack of insulating layers of different materials. A wiring electrically connected to a source region and a drain region of the thin film transistor 211 is formed over the interlayer insulating layer 207. In addition, over the interlayer insulating layer 207, an electrode 221, an electrode 222, and an electrode 223, each of which is formed using the same material and the same step as those of the wiring, are formed. The electrodes 221 to 223 are formed using a metal film, e.g., a low resistance metal film. Such a low resistance metal film can be formed using an aluminum alloy, pure aluminum, or the like. The electrodes 221 to 223 may have a stacked structure of such a low resistance metal film and a high-melting-point metal film; for example, a three-layer structure of a titanium layer, an aluminum layer, and a titanium layer which are stacked in this order may be employed. Instead of the stacked structure of the high-melting-point metal film and the low resistance metal film, a single conductive layer can be used. Such a single conductive layer may be formed using an element selected from titanium, tungsten, tantalum, molybdenum, neodymium, cobalt, zirconium, zinc, ruthenium, rhodium, palladium, osmium, iridium, or platinum; a single film using an alloy material or a compound material containing the aforementioned element as its main component; or a single film using nitride of the aforementioned element, e.g., titanium nitride, tungsten nitride, tantalum nitride, or molybdenum nitride.

The interlayer insulating layer 207, the gate insulating layer 205, and the insulating layer 202 are etched so as to have tapered end portions. With the interlayer insulating layer 207, the gate insulating layer 205, and the insulating layer 202 processed to have the tapered end portions, coverage with a protective layer 227 formed over these insulating layers is improved, which brings an effect of blocking entrance of moisture, impurities, and the like.

Over the interlayer insulating layer 207, a first semiconductor layer 103, a second semiconductor layer 104, and a third semiconductor layer 105 are formed. The first semiconductor layer 103 is provided so as to be in contact with the electrode 222 at least partially. The first semiconductor layer 103 is formed using a microcrystalline semiconductor layer, and over the first semiconductor layer 103, the second semiconductor layer 104 in which first crystal regions 104a and second crystal regions 104b exist in an amorphous structure is formed. The third semiconductor layer 105 is formed over the second semiconductor layer 104. The second semiconductor layer 104 is formed as follows: at at least the initial stage of the film deposition of the second semiconductor layer 104, film deposition is performed with the reaction gas with the flow rate of the dilution gas to the semiconductor source gas, being greater than or equal to 1 time and less than or equal to 6 times, so that the first crystal regions 104a are grown from the interface between the first semiconductor layer 103 and the second semiconductor layer 104; and after that, the flow ratio between the dilution gas and the semiconductor source gas is adjusted to change the mixture ratio capable of production of a microcrystalline semiconductor and an impurity element (typically nitrogen) which interrupts crystal nucleation is contained in a reaction space where the oxygen concentration is decreased, and film deposition is performed for a predetermined period of time; and then, crystal nuclei are produced at a position which is away from the interface between the first semiconductor layer 103 and the second semiconductor layer 104, so that the second crystal regions 104b are grown. Specifically, the first semiconductor layer 103, the second semiconductor layer 104, and the third semiconductor layer 105 are the same or substantially the same as those illustrated in FIGS. 7A to 7C, FIG. 8, FIGS. 9A to 9C, and FIG. 10. The protective layer 227 is formed using, for example, silicon nitride over the photoelectric conversion layer 225. The protective layer 227 can prevent moisture and impurities such as organic substances from being mixed into the thin film transistor 211 and me photoelectric conversion layer 225. An interlayer insulating layer 228 formed using an organic resin material such as polyimide or acrylic is provided over the protective layer 227. An electrode 231 and an electrode 232 are provided over the interlayer insulating layer 228. The electrode 231 is electrically connected to the electrode 221. The electrode 232 is electrically connected to an upper layer of the photoelectric conversion layer 225 (the third semiconductor layer 105) and the electrode 223 through contact holes in the interlayer insulating layer 228 and the protective layer 227. As the electrodes 231 and 232, tungsten, titanium, tantalum, silver, or the like can be used.

An interlayer insulating layer 235 is provided over the interlayer insulating layer 228 by a screen printing method or an inkjet method, using an organic resin material such as an epoxy resin, polyimide, acrylic, or a phenol resin. The interlayer insulating layer 235 is provided with openings over the electrode 231 and the electrode 232. Over the interlayer insulating layer 235, an electrode 241 that is electrically connected to the electrode 231 and an electrode 242 that is electrically connected to the electrode 232 are provided by a printing method, for example, using a nickel paste.

In the photoelectric conversion device functioning as the photosensor device illustrated in FIG. 11, the second semiconductor layer 104 which forms a main part of the photoelectric conversion layer has a structure in which the first crystal regions 104a and the second crystal regions 104b exist in an amorphous structure. Therefore, superior photoelectric conversion characteristic to a conventional photoelectric conversion device using an amorphous silicon thin film can be obtained with the same or substantially the same thickness as the conventional amorphous silicon thin film. FIG. 11 illustrates the photosensor device in which the photoelectric conversion layer 225 is provided in the light-receiving portion and an output of the photoelectric conversion layer 225 is amplified by the amplifier circuit including the thin film transistor 211 and then output; and if the structure relating to the amplifier circuit is eliminated, the device can be used as a photosensor.

Embodiment 6

Embodiment 6 will describe an example of an integrated photoelectric conversion device having a structure different from that described in the above embodiment. Outline of the manufacturing process of the integrated photoelectric conversion device according to Embodiment 6 will be described below.

Figures 12A, 12B:
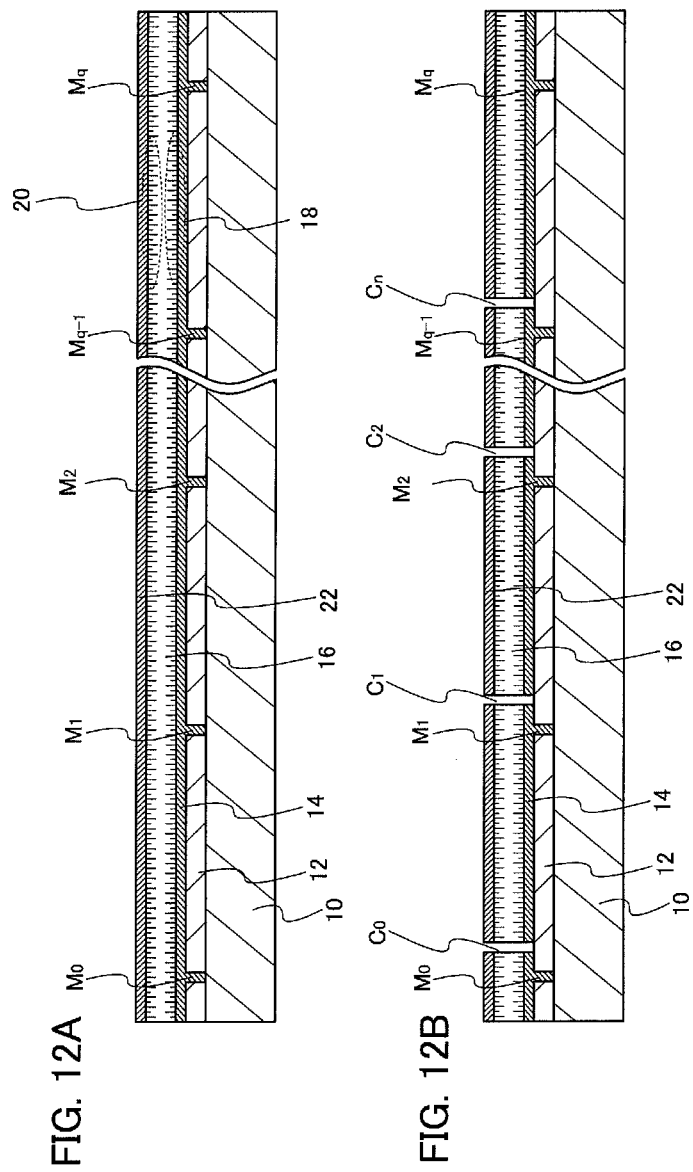
FIGS. 12A and 12B are cross-sectional diagrams showing a manufacturing process of an integrated photoelectric conversion device according to one embodiment of the present invention.

FIGS. 12A and 12B and FIGS. 13A and 13B illustrate the process for manufacturing a photoelectric conversion device in which a plurality of unit cells provided over one substrate with an insulating surface is connected in series over the substrate. In FIG. 12A, a first electrode 12 is formed over a substrate 10. The first electrode 12 is isolated into a plurality of first electrodes by openings $M_0$ to $M_q$. The openings $M_0$ to $M_q$ are formed as follows: a conductive layer is formed over the entire surface of the substrate 10, and the conductive layer is directly processed, corresponding to the pattern of the opening, by etching or using an energy beam such as laser beam.

In the case where the conductive layer, a semiconductor layer, and an insulating layer, which are formed over the substrate 10, are processed by laser processing, the processing is preferably performed by the laser beam condensing by an optical system. This is because minute processing is enabled. In order to process a large substrate efficiently as described above, it is efficient that an elongated opening is formed with a laser beam condensing into a linear shape, once or plural times.

In FIG. 12A, a photoelectric conversion layer is formed after the openings $M_0$ to $M_q$ are formed in the first electrode 12. FIG. 12A illustrates the case where a first semiconductor layer 14 (an n-type-impurity semiconductor layer), a second semiconductor layer 16 (an i-type semiconductor layer), and a third semiconductor layer 22 (a p-type-impurity semiconductor layer) are formed in this order from the first electrode 12 side. In the second semiconductor layer 16, first crystal regions 18 exist on the interface side between the first semiconductor layer 14 and the second semiconductor layer 16, and second crystal regions 20 exist on the interface side between the second semiconductor layer 16 and the third semiconductor layer 22. As the structure of the photoelectric conversion layer, the structure shown in FIG. 5 can also be employed instead of this structure.

In FIG. 12B, openings $C_0$ to $C_n$ are formed in the photoelectric conversion layer. The openings $C_0$ to $C_n$ penetrate the first semiconductor layer 14, the second semiconductor layer 16, and the third semiconductor layer 22, and are processed so that a surface or a side face of the first electrode 12 is exposed. The openings $C_0$ to $C_n$ are formed so as to be adjacent to their respective openings $M_0$ to $M_q$ with a predetermined interval therebetween. This step can also be performed by laser processing.

Figures 13A, 13B:
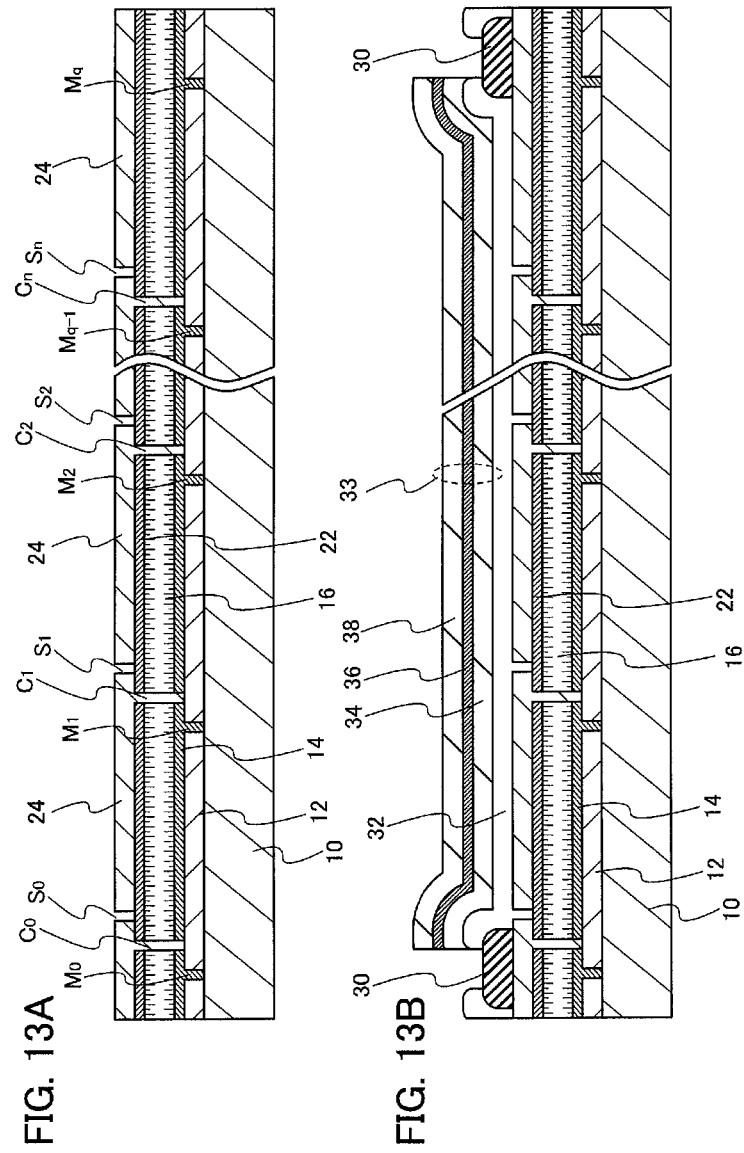
FIGS. 13A and 13B are cross-sectional diagrams showing the manufacturing process of the integrated photoelectric conversion device according to one embodiment of the present invention.

In FIG. 13A, a second electrode 24 is formed. The second electrode 24 is separated into a plurality of second electrodes by openings $S_0$ to $S_n$, and is electrically connected to the first electrode 12 through the openings $C_0$ to $C_n$. The openings $S_0$ to $S_n$ are formed so as to be adjacent to their respective openings $C_0$ to $C_n$ with a predetermined interval therebetween. This step can also be performed by laser processing. In the case of performing laser processing, selective processing becomes easy when chromium having a sublimation property is used to form the second electrode 24.

Accordingly, an integrated structure in which a plurality of unit cells each having the photoelectric conversion layer between the first electrode 12 and the second electrode 24 is formed and is connected in series can be obtained.

FIG. 13B shows the structure in which an extraction electrode 30 is provided over the second electrode 24 and is covered with a protective layer 32, and a protective film 33 is provided thereover. The protective film 33 has a three-layer structure. A layer 34 of ethylene vinyl acetate (EVA) is an adhesive layer which is melted when being heated. A layer 36 of aluminum foil is a layer for blocking moisture, which interrupts moisture vapor from entering from outside. An outer surface film 38 is formed using polyethylene terephthalate (PET) or the like. Through the above, a photoelectric conversion device in which the plurality of unit cells is connected over the substrate 10 can be obtained.

The photoelectric conversion device according to one embodiment of the present invention has a structure in which the second semiconductor layer 16 which is the main part for performing photoelectric conversion includes a plurality of crystal regions in an amorphous structure; accordingly, a photoelectric conversion device with improved photoelectric conversion characteristic can be obtained. Further, a photoelectric conversion device with less characteristic degradation due to photodegradation can be obtained.

This application is based on Japanese Patent Application serial no. 2008-123332 filed with Japan Patent Office on May 9, 2008, the entire contents of which are hereby incorporated by reference.

What is claimed is:

1. A photoelectric conversion device comprising:
a first semiconductor layer containing an impurity element imparting one conductivity type, which is formed using a microcrystalline semiconductor and provided over a first electrode;
a second semiconductor layer which is provided over the first semiconductor layer;
a third semiconductor layer containing an impurity element imparting a conductivity type which is opposite to the one conductivity type, which is provided over the second semiconductor layer; and
a second electrode which is provided over the third semiconductor layer,
wherein the second semiconductor layer includes on an interface side between the first semiconductor layer and the second semiconductor layer, a first crystal region having a three-dimensional shape which decreases in width from an interface between the first semiconductor layer and the second semiconductor layer toward the third semiconductor layer,
wherein the second semiconductor layer includes a second crystal region having a conical or pyramidal shape,
wherein the conical or pyramidal shape includes a vertex in the second semiconductor layer and a base in an interface between the second semiconductor layer and the third semiconductor layer,
wherein the conical or pyramidal shape decreases in width from the interface between the second semiconductor layer and the third semiconductor layer toward the first semiconductor layer, and
wherein the second semiconductor layer has a plane including neither the first crystal region nor the second crystal region, and being parallel to the interface between the first semiconductor layer and the second semiconductor layer.

2. The photoelectric conversion device according to claim 1,
wherein the first crystal region is grown while decreasing in width from the first semiconductor layer in a deposition direction of the second semiconductor layer, and
wherein the second crystal region is grown while increasing in width from the vertex in the deposition direction of the second semiconductor layer.

3. The photoelectric conversion device according to claim 1,
wherein the first crystal region and the second crystal region which are crystalline semiconductors exist in an amorphous structure in the second semiconductor layer.

4. The photoelectric conversion device according to claim 1,
wherein the second crystal region is a single crystal or a single crystal including a twin crystal.

5. The photoelectric conversion device according to claim 1,
wherein in the second semiconductor layer, the second crystal region is grown toward the third semiconductor layer from a region where a nitrogen concentration measured by secondary ion mass spectrometry is more than or equal to $2 \times 10^{20}/cm^3$ and less than or equal to $7 \times 10^{20}/cm^3$.

6. The photoelectric conversion device according to claim 1,
wherein in the second semiconductor layer, a peak concentration of nitrogen measured by secondary ion mass spectrometry is $3 \times 10^{20}/cm^3$ to $1 \times 10^{21}/cm^3$ at and near the vertex in the second crystal region, and a nitrogen concentration is decreased from the vertex toward the interface between the second semiconductor layer and the third semiconductor layer.

7. The photoelectric conversion device according to claim 1,
wherein the first semiconductor layer is an n-type semiconductor, the second semiconductor layer is an i-type semiconductor, and the third semiconductor layer is a p-type semiconductor.

8. A photoelectric conversion device comprising:
a first semiconductor layer containing an impurity element imparting one conductivity type, which is provided over a first electrode;
a second semiconductor layer which is provided over the first semiconductor layer;
a third semiconductor layer containing an impurity element imparting a conductivity type which is opposite to the one conductivity type, which is provided over the second semiconductor layer; and
a second electrode which is provided over the third semiconductor layer,
wherein the second semiconductor layer includes on an interface side between the first semiconductor layer and the second semiconductor layer, a first crystal region having a three-dimensional shape which decreases in width from an interface between the first semiconductor layer and the second semiconductor layer toward the third semiconductor layer,
wherein the second semiconductor layer includes a second crystal region having a conical or pyramidal shape,
wherein the conical or pyramidal shape includes a vertex in the second semiconductor layer and a base in an interface between the second semiconductor layer and the third semiconductor layer,
wherein the conical or pyramidal shape in width from the interface between the second semiconductor layer and the third semiconductor layer toward the first semiconductor layer, and
wherein the second semiconductor layer has a plane including neither the first crystal region nor the second crystal region, and being parallel to the interface between the first semiconductor layer and the second semiconductor layer.

9. The photoelectric conversion device according to claim 8,
wherein the first crystal region is grown while decreasing in width from the first semiconductor layer in a deposition direction of the second semiconductor layer, and
wherein the second crystal region is grown while increasing in width from the vertex in the deposition direction of the second semiconductor layer.

10. The photoelectric conversion device according to claim 8,
wherein the first crystal region and the second crystal region which are crystalline semiconductors exist in an amorphous structure in the second semiconductor layer.

11. The photoelectric conversion device according to claim 8,
wherein the second crystal region is a single crystal or a single crystal including a twin crystal.

12. The photoelectric conversion device according to claim 8,
wherein in the second semiconductor layer, the second crystal region is grown toward the third semiconductor layer from a region where a nitrogen concentration measured by secondary ion mass spectrometry is more than or equal to $2 \times 10^{20}/cm^3$ and less than or equal to $7 \times 10^{20}/cm^3$.

13. The photoelectric conversion device according to claim 8,
wherein in the second semiconductor layer, a peak concentration of nitrogen measured by secondary ion mass spectrometry is $3 \times 10^{20}/cm^3$ to $1 \times 10^{21}/cm^3$ at and near the vertex in the second crystal region, and a nitrogen concentration is decreased from the vertex toward the interface between the second semiconductor layer and the third semiconductor layer.

14. The photoelectric conversion device according to claim 8,
wherein the first semiconductor layer is an n-type semiconductor, the second semiconductor layer is an i-type semiconductor, and the third semiconductor layer is a p-type semiconductor.

15. The photoelectric conversion device according to claim 5,
wherein the vertex is provided in the region where a nitrogen concentration measured by secondary ion mass spectrometry is more than or equal to $2 \times 10^{20}/cm^3$ and less than or equal to $7 \times 10^{20}/cm^3$.

16. The photoelectric conversion device according to claim 12,
wherein the vertex is provided in the region where a nitrogen concentration measured by secondary ion mass spectrometry is more than or equal to $2 \times 10^{20}/cm^3$ and less than or equal to $7 \times 10^{20}/cm^3$.

* * * * *